US012812991B2

(12) United States Patent
Ouchi

(10) Patent No.: US 12,812,991 B2
(45) Date of Patent: Nov. 24, 2026

(54) SOLID-STATE IMAGING DEVICE AND ELECTRONIC DEVICE

(71) Applicant: Sony Semiconductor Solutions Corporation, Kanagawa (JP)

(72) Inventor: Hidemitsu Ouchi, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 310 days.

(21) Appl. No.: 18/727,978

(22) PCT Filed: Jan. 10, 2023

(86) PCT No.: PCT/JP2023/000266
§ 371 (c)(1),
(2) Date: Jul. 10, 2024

(87) PCT Pub. No.: WO2023/162487
PCT Pub. Date: Aug. 31, 2023

(65) Prior Publication Data

US 2025/0081643 A1 Mar. 6, 2025

(30) Foreign Application Priority Data

Feb. 28, 2022 (JP) ................................ 2022-030320

(51) Int. Cl.
*H10F 39/00* (2025.01)
*H04N 23/30* (2023.01)

(52) U.S. Cl.
CPC ......... *H10F 39/8037* (2025.01); *H04N 23/30* (2023.01); *H10F 39/809* (2025.01)

(58) Field of Classification Search
CPC ............................ H04N 23/30; H10F 39/8037
See application file for complete search history.

(56) References Cited

U.S. PATENT DOCUMENTS

2021/0021778 A1* 1/2021 Bairo ...................... H04M 1/02
2023/0097485 A1* 3/2023 Kino ...................... H04N 25/78 257/292

FOREIGN PATENT DOCUMENTS

JP S63175481 A 7/1988
JP H05267653 A 10/1993
JP 2019140531 A 8/2019
WO 2011030391 A1 3/2011
WO 2021186969 A1 9/2021

OTHER PUBLICATIONS

International Search Report (PCT/ISA/210), International Application No. PCT/JP2023/000266, dated Mar. 28, 2023.

* cited by examiner

*Primary Examiner* — Benjamin P Sandvik
(74) *Attorney, Agent, or Firm* — Michael Best & Friedrich LLP

(57) ABSTRACT

Solid-state imaging devices and electronic devices with reduced noise are disclosed. In one example, a solid-state imaging device includes a first substrate including a photodiode and a transfer transistor, and a second substrate including an active load circuit and a differential pair circuit for a comparator, in which the active load circuit includes a first transistor, the differential pair circuit includes a second transistor, and transconductance of the first transistor is smaller than transconductance of the second transistor.

20 Claims, 14 Drawing Sheets

FIG. 4

A $$RN \propto \frac{1}{A_{az}} \sqrt{2 \cdot 2 \cdot \frac{4\gamma_n kT}{g^m{}_n}\left(1 + \frac{\gamma_p}{\gamma_n}\frac{g^m{}_p}{g^m{}_n}\right) \cdot NBW} \quad [\mathrm{V_{rms}}] \quad \cdots \quad (1)$$

B $$g^m = \sqrt{2\beta I_D} = \sqrt{2\frac{W}{L}\mu_0 C_{OX} I_D} \quad \cdots \quad (2)$$

A

B

SOLID-STATE IMAGING DEVICE AND ELECTRONIC DEVICE

TECHNICAL FIELD

The present disclosure relates to a solid-state imaging device and an electronic device.

BACKGROUND ART

For a solid-state imaging device, miniaturization of a pixel transistor, reduction of noise of the solid-state imaging device, and the like are required. For example, it is considered to reduce noise by making sizes of an input transistor and a reference transistor included in a differential pair circuit in a comparator or an analog to digital (AD) converter different. Accordingly, noise can be reduced by adjusting the transconductance ratio between the input transistor and the reference transistor.

CITATION LIST

Patent Document

Patent Document 1: Japanese Patent Application Laid-Open No. 2019-140531

SUMMARY OF THE INVENTION

Problems to be Solved by the Invention

However, noise of a solid-state imaging device is affected not only by transconductance of an input transistor and a reference transistor but also by transconductance of a load transistor. Therefore, it is difficult to sufficiently reduce noise in the above-described method. Furthermore, since the transconductance generally changes with miniaturization of pixel transistors, it is difficult to achieve both miniaturization of the pixel transistors and noise reduction.

Therefore, the present disclosure provides a solid-state imaging device and an electronic device capable of reducing noise in a suitable manner.

Solutions to Problems

A solid-state imaging device of a first aspect of the present disclosure includes: a first substrate including a photodiode and a transfer transistor; and a second substrate including an active load circuit and a differential pair circuit for a comparator, in which the active load circuit includes a first transistor, the differential pair circuit includes a second transistor, and transconductance of the first transistor is smaller than transconductance of the second transistor. As a result, for example, it is possible to reduce noise of the solid-state imaging device in a suitable manner, such as making it easier to achieve both miniaturization of pixel transistors and reduction of noise of the solid-state imaging device.

Furthermore, in the first aspect, an area of an LDD region on a source region side and a drain region side of the first transistor may be larger than an area of an LDD region on a source region side and a drain region side of the second transistor in plan view, respectively. As a result, for example, the transconductance of each transistor can be adjusted by the area of the LDD region.

Furthermore, in the first aspect, an area of a source region and a drain region of the first transistor may be narrower than an area of a source region and a drain region of the second transistor in plan view, respectively. As a result, for example, the transconductance of each transistor can be adjusted by changing the area of the LDD region in the total area of the source region, the drain region, and the LDD region.

Furthermore, in the first aspect, a film thickness of a sidewall insulating film of the first transistor may be thicker than a film thickness of a sidewall insulating film of the second transistor. As a result, for example, the area of the LDD region can be adjusted by forming the LDD region using the sidewall insulating film as a mask.

Furthermore, in the first aspect, a width of an LDD region on a source region side and a drain region side of the first transistor may be equal to a film thickness of a sidewall insulating film of the first transistor, and a width of an LDD region on a source region side and a drain region side of the second transistor may be equal to a film thickness of a sidewall insulating film of the second transistor. As a result, for example, the area of the LDD region can be adjusted by forming the LDD region using the sidewall insulating film as a mask.

Furthermore, in the first aspect, a film thickness of a sidewall insulating film of the first transistor may be equal to a film thickness of a sidewall insulating film of the second transistor. As a result, for example, the area of the LDD region can be adjusted by forming the LDD region using a film other than the sidewall insulating film as a mask.

Furthermore, in the first aspect, a width of an LDD region on a source region side and a drain region side of the first transistor may be different from a film thickness of a sidewall insulating film of the first transistor, and a width of an LDD region on a source region side and a drain region side of the second transistor may be different from a film thickness of a sidewall insulating film of the second transistor. As a result, for example, the area of the LDD region can be adjusted by forming the LDD region using a film other than the sidewall insulating film as a mask.

Furthermore, in the first aspect, a total contact area between a source region and a drain region of the first transistor and one or more contact plugs of the first transistor may be smaller than a total contact area between a source region and a drain region of the second transistor and one or more contact plugs of the second transistor, respectively. As a result, for example, the transconductance of each transistor can be adjusted by the total contact area with the contact plugs.

Furthermore, in the first aspect, a part of the contact plugs of the first transistor may be disposed on an insulating film. As a result, for example, the total contact area described above can be adjusted by interposing an insulating film between the source region and the drain region and the contact plugs.

Furthermore, in the first aspect, the insulating film may be a sidewall insulating film of the first transistor. As a result, for example, the total contact area described above can be adjusted by disposing the contact plugs on the sidewall insulating film in an overlapping manner.

Furthermore, in the first aspect, the insulating film may be an element isolation insulating film surrounding a source region and a drain region of the first transistor in plan view. As a result, for example, the total contact area described above can be adjusted by disposing the contact plugs on the element isolation insulating film in an overlapping manner.

Furthermore, in the first aspect, an area of each contact plug of the first transistor may be smaller than an area of each contact plug of the second transistor in plan view. As a result, for example, the total contact area described above can be adjusted by adjusting the area of each contact plug.

Furthermore, in the first aspect, a shape of each contact plug of the first transistor may be similar to a shape of each contact plug of the second transistor in plan view. As a result, for example, the total contact area described above can be adjusted by enlarging or reducing the planar shape of each contact plug.

Furthermore, in the first aspect, a shape of each contact plug of the first transistor may be not similar to a shape of each contact plug of the second transistor in plan view. As a result, for example, the total contact area described above can be adjusted by freely deforming the planar shape of each contact plug.

Furthermore, in the first aspect, a number of the contact plugs of the first transistor may be smaller than a number of the contact plugs of the second transistor. As a result, for example, the total contact area described above can be adjusted by adjusting the number of the contact plugs.

Furthermore, in the first aspect, an area of each contact plug of the first transistor may be equal to an area of each contact plug of the second transistor in plan view. As a result, for example, the total contact area described above can be adjusted by adjusting the number of the contact plugs having the same planar shape.

Furthermore, in the first aspect, the first transistor is a transistor of a first conductivity type, and the second transistor may be a transistor of a second conductivity type different from the first conductivity type. As a result, for example, one of the active load circuit and the differential pair circuit can be formed using a p-type transistor, and the other of the active load circuit and the differential pair circuit can be formed using an n-type transistor.

Furthermore, in the first aspect, the first transistor and the second transistor may be provided on a same semiconductor substrate. As a result, for example, the active load circuit and the differential pair circuit can be provided on the same semiconductor substrate. Furthermore, in the first aspect, the first substrate may be disposed on the second substrate, and the second substrate is disposed on a third substrate. As a result, for example, it is possible to reduce noise of the solid-state imaging device having a three-layer structure in a suitable manner.

An electronic device of a second aspect of the present disclosure is an electronic device including an imaging device, the imaging device including: a first substrate including a photodiode and a transfer transistor; and a second substrate including an active load circuit and a differential pair circuit for a comparator, in which the active load circuit includes a first transistor, the differential pair circuit includes a second transistor, and transconductance of the first transistor is smaller than transconductance of the second transistor. As a result, for example, as a result, for example, it is possible to reduce noise of the imaging device in a suitable manner, such as making it easier to achieve both miniaturization of pixel transistors and reduction of noise of the imaging device.

BRIEF DESCRIPTION OF DRAWINGS

FIG. 4 is formulas for describing characteristics of the solid-state imaging device of the first embodiment.

MODE FOR CARRYING OUT THE INVENTION

Hereinafter, embodiments of the present disclosure will be described with reference to the drawings.

First Embodiment

Figure 1:
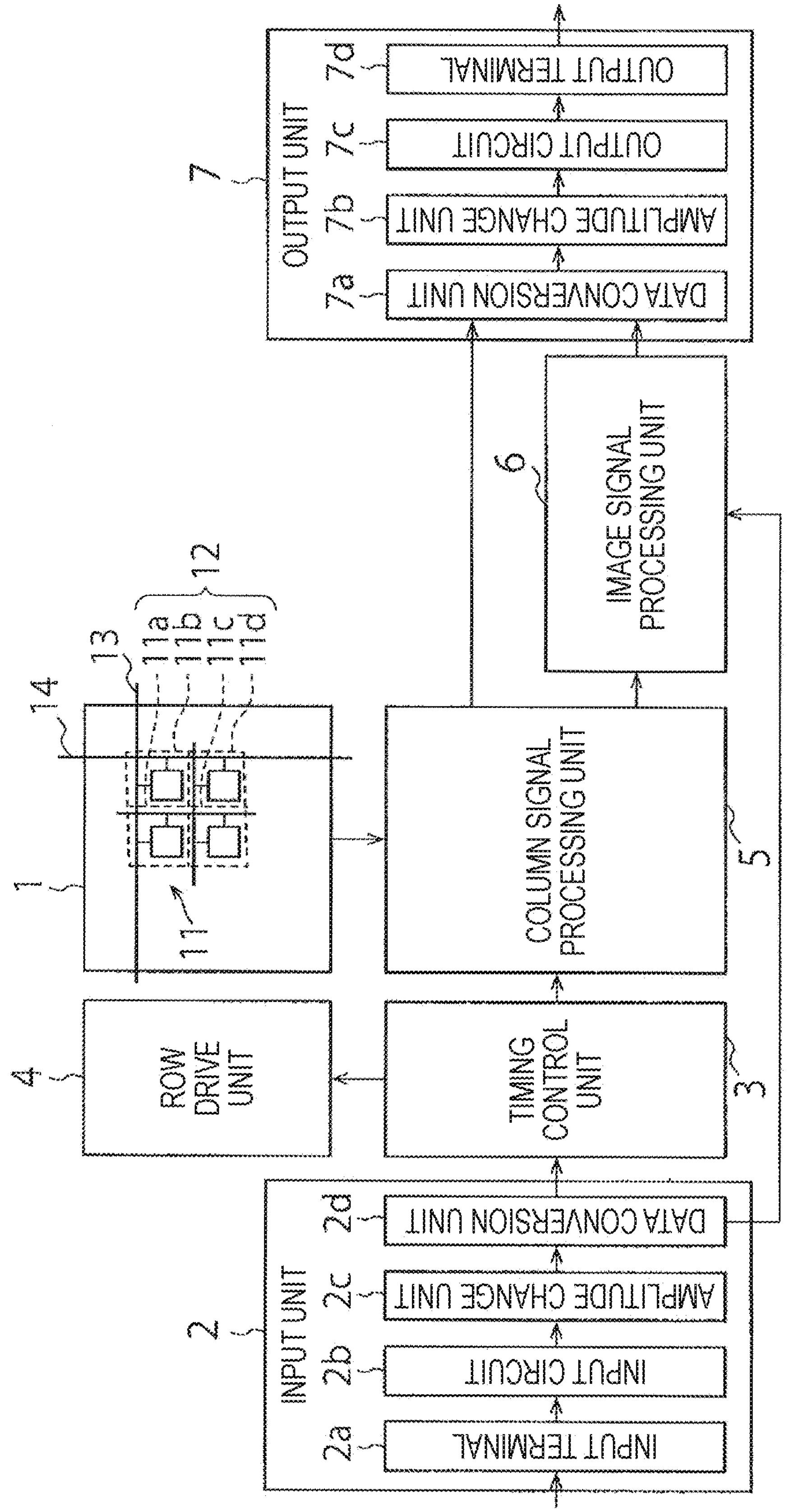
FIG. 1 is a block diagram illustrating a configuration of a solid-state imaging device of a first embodiment.

FIG. 1 is a block diagram illustrating a configuration of a solid-state imaging device of a first embodiment. The solid-state imaging device of the present embodiment is, for example, an image sensor such as a complementary metal oxide semiconductor (CMOS) image sensor (CIS).

As illustrated in FIG. 1, the solid-state imaging device of the present embodiment includes a pixel array unit 1, an input unit 2, a timing control unit 3, a row drive unit 4, a column signal processing unit 5, an image signal processing unit 6, and an output unit 7. The input unit 2 includes an input terminal 2*a*, an input circuit 2*b*, an amplitude change unit 2*c*, and a data conversion unit 2*d*. The output unit 7 includes a data conversion unit 7*a*, an amplitude change unit 7*b*, an output circuit 7*c*, and an output terminal 7*d*.

The pixel array unit 1 includes a plurality of pixels 11 arranged in a two-dimensional array. The pixel array unit 1 of the present embodiment includes a plurality of pixel sharing units 12, and each of the pixel sharing units 12 includes two or more pixels 11 (here, 2*2 pixels 11*a* to 11*d*). FIG. 1 illustrates one of these pixel sharing units 12. The pixel array unit 1 further includes a plurality of row drive signal lines 13 that extends in the row direction (lateral direction, horizontal direction) and a plurality of column read lines 14 that extends in the column direction (longitudinal direction, vertical direction). FIG. 1 illustrates one of the row drive signal lines 13 and one of the column read lines 14. Each of the pixels 11 includes one photodiode that performs photoelectric conversion for imaging, and the plurality of pixels 11 described above in each of the pixel sharing units 12 shares one pixel circuit that performs imaging control and the like. The pixel circuit includes, for example, a comparator.

The input unit 2 receives as input a reference clock signal, a timing control signal, characteristic data, and the like from the outside to the inside of the solid-state imaging device. The reference clock signal is a signal that serves as a reference of operation of the solid-state imaging device. The timing control signal includes a horizontal synchronization signal and a vertical synchronization signal. The characteristic data is, for example, data for storing an image signal in the solid-state imaging device. These signals are taken in by the input circuit 2*b* from the input terminal 2*a*, the amplitudes of these signals are changed to amplitudes that are easy to use by the amplitude change unit 2*c*, and the arrangement of data strings included in these signals is changed by the data conversion unit 2*d*. For example, the data conversion unit 2*d* converts these signals from serial signals to parallel signals.

The timing control unit 3 supplies a signal for controlling timing to the row drive unit 4 and the column signal processing unit 5 on the basis of a reference clock signal and a timing control signal.

The row drive unit 4 includes, for example, a row decoder and a row drive circuit. The row decoder determines a row to be subjected to pixel driving. The row drive circuit generates a signal for driving the pixels 11 and supplies the signal to the row (row drive signal line 13) determined by the row decoder.

The column signal processing unit 5 includes, for example, a load circuit, an amplifier circuit, a noise processing unit, an AD converter, a scanning circuit, and the like. The load circuit is electrically connected to the column read line 14, and forms a source follower circuit with the pixel sharing unit 12. The amplifier circuit amplifies a pixel signal read from the pixel supply unit 12 via the column read line 14. The noise processing unit removes noise from a pixel signal. The AD converter converts a pixel signal from an analog signal to a digital signal. The AD converter includes, for example, a comparator that compares a pixel signal with a reference signal, and a counter that counts a time until a comparison result of the comparator is inverted. The scanning circuit scans a read column (column read line 14) so as to output a pixel signal.

The image signal processing unit 6 performs various types of signal processing on data obtained by photoelectric conversion performed by the pixel array unit 1, such as an image signal output from the pixel array unit 1. The image signal processing unit 6 includes, for example, a data processing unit and a data holding unit. The data processing unit performs, for example, tone curve correction for increasing or decreasing the number of gradations of the image. The data holding unit stores, for example, data used for tone curve correction in advance.

The output unit 7 outputs image data obtained by processing an image signal output from the pixel array unit 1 by the column signal processing unit 5 or the image signal processing unit 6 from the inside to the outside of the solid-state imaging device. The image data is converted from a parallel signal to a serial signal by the data conversion unit 7*a*, the amplitude of this signal is changed to an amplitude that is easy to use by the amplitude change unit 7*b*, and this signal is output from the output terminal 7*d* by the output circuit 7*c*.

Figure 2:
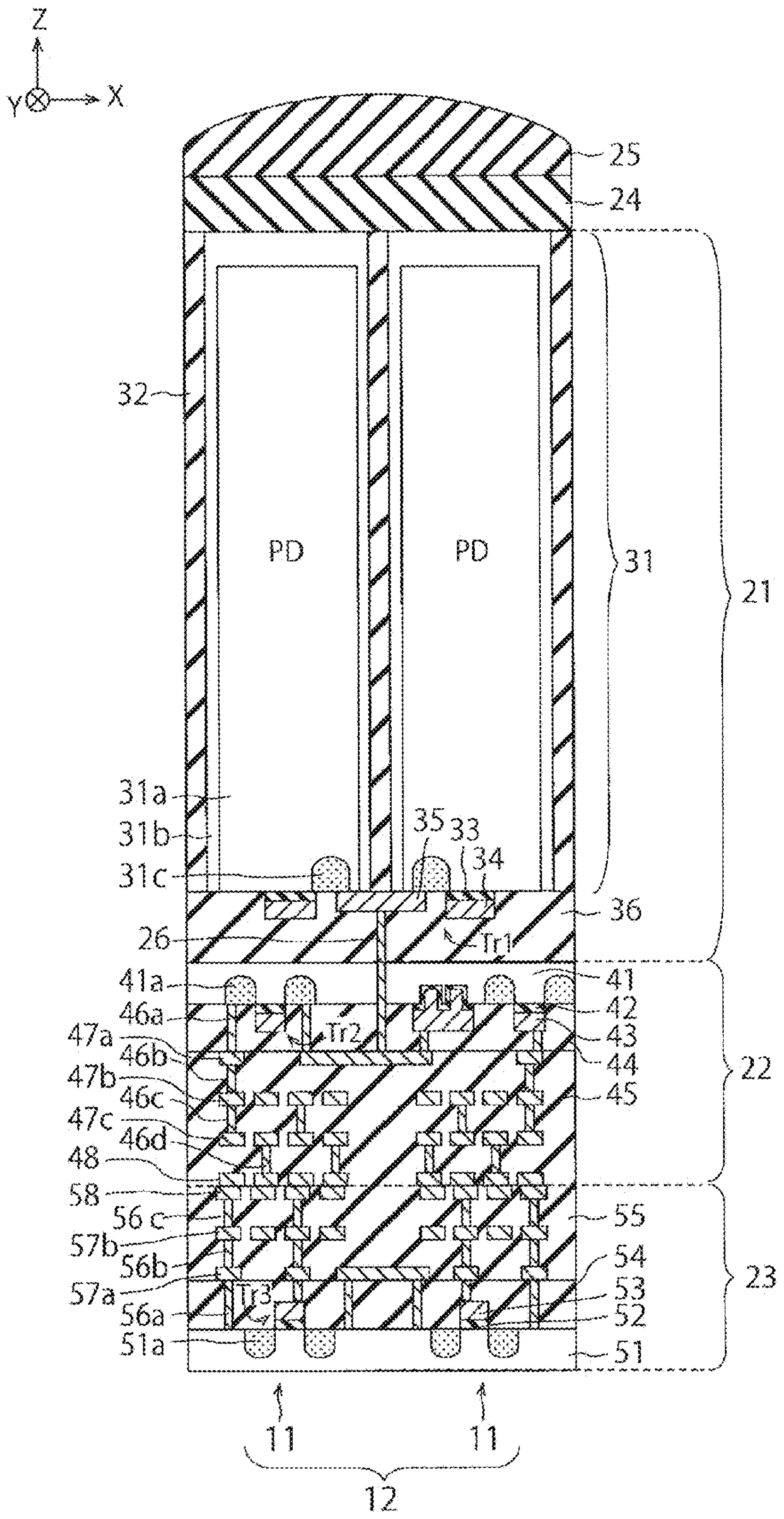
FIG. 2 is a cross-sectional view illustrating a structure of the solid-state imaging device of the first embodiment.

FIG. 2 is a cross-sectional view illustrating a structure of the solid-state imaging device of the first embodiment. FIG. 2 illustrates a cross section of two of the pixels 11 (one pixel sharing unit 12) included in the solid-state imaging device illustrated in FIG. 1.

FIG. 2 illustrates an X axis, a Y axis, and a 2 axis perpendicular to each other. An X direction and a Y direction correspond to a lateral direction (horizontal direction), and a Z direction corresponds to a longitudinal direction (vertical direction).

Furthermore, a +Z direction corresponds to an upward direction, and a −Z direction corresponds to a downward direction. Note that the −Z direction may strictly match the gravity direction, or does not necessarily strictly match the gravity direction.

As illustrated in FIG. 2, the solid-state imaging device of the present embodiment includes a first substrate 21, a second substrate 22, a third substrate 23, a filter layer 24, an on-chip lens layer 25, and a through plug 26. The first substrate 21 is disposed on the second substrate 22, and the second substrate 22 is disposed on the third substrate 23. The filter layer 24 and the on-chip lens layer 25 are sequentially formed on the first substrate 21. The through plug 26 is formed in the first substrate 21 and the second substrate 22 so as to penetrate the boundary surface between the first substrate 21 and the second substrate 22.

The first substrate 21 includes a semiconductor substrate 31, an element isolation insulating film 32, a gate insulating film 33 and a gate electrode 34 of each transistor Tr1, an electrode portion 35, an interlayer insulating film 36, and a photodiode PD of each of the pixels 11. The semiconductor substrate 31 includes an n-type region 31*a*, a p-type region 31*b*, and a floating diffusion portion 31*c* for each of the pixels 11.

The second substrate 22 includes a semiconductor substrate 41, a gate insulating film 42 and a gate electrode 43 of each transistor Tr2, an interlayer insulating film 44, an interlayer insulating film 45, a plurality of plugs 46*a* to 46*d*, a plurality of wiring layers 47*a* to 47*c*, and a plurality of pads 48. The semiconductor substrate 41 includes a plurality of diffusion regions 41*a*.

The third substrate 23 includes a semiconductor substrate 51, a gate insulating film 52 and a gate electrode 53 of each transistor Tr3, an interlayer insulating film 54, an interlayer insulating film 55, a plurality of plugs 56*a* to 56*c*, a plurality of wiring layers 57*a* and 57*b*, and a plurality of pads 58. The semiconductor substrate 51 includes a plurality of diffusion regions 51*a*.

The semiconductor substrate 31 is, for example, a silicon (Si) substrate. In FIG. 2, a surface (lower surface) of the semiconductor substrate 31 in the −Z direction is the front surface of the semiconductor substrate 31, and a surface (upper surface) of the semiconductor substrate 31 in the +2 direction is the back surface of the semiconductor substrate 31. Since the solid-state imaging device of the present embodiment is of a back-illuminated type, the back surface of the semiconductor substrate 31 is a light incident surface (light reception surface) of the semiconductor substrate 31.

The semiconductor substrate 31 includes a photodiode PD for each of the pixels 11. The photodiode PD of each of the pixels 11 is mainly formed by pn junction between the n-type region 31*a* and the p-type region 31*b*, and functions as a photoelectric conversion unit. The photodiode PD of each of the pixels 11 receives light from the back surface side of the semiconductor substrate 31, generates a signal charge corresponding to the light amount of received light, and accumulates the generated signal charge in the floating diffusion portion 31*c*.

The element isolation insulating film 32 is included in the semiconductor substrate 31, and penetrates the semiconductor substrate 31 between the front surface and the back surface of the semiconductor substrate 31. The element isolation insulating film 32 is, for example, a silicon oxide film ($SiO_2$ film). The solid-state imaging device of the present embodiment may further include a light shielding layer (for example, a tungsten (W) layer) embedded in the element isolation insulating film 32. The element isolation insulating film 32 has a mesh shape surrounding the plurality of pixels 11 described above for each of the pixels 11 in plan view.

The first substrate 21 includes a plurality of transistors Tr1. These transistors Tr1 include, for example, pixel transistors such as transfer transistors. The gate insulating film 33 and the gate electrode 34 of each of the transistors Tr1 are sequentially formed on the front surface of the semiconductor substrate 31. The gate insulating film 33 is, for example, a $SiO_2$ film. The gate electrode 34 is, for example, a poly-Si layer.

The electrode portion 35 is formed on the front surface of the semiconductor substrate 31 and is in contact with the floating diffusion portion 31*c*. The electrode portion 35 is, for example, a poly-Si layer. The gate electrode 34 and the electrode portion 35 of the present embodiment are formed by the same material being processed.

The interlayer insulating film 36 is formed on the front surface of the semiconductor substrate 31 and covers the gate electrode 34 and the electrode portion 35. The interlayer insulating film 36 is, for example, a $SiO_2$ film.

The semiconductor substrate 41 is, for example, a Si substrate. The semiconductor substrate 41 is disposed on the lower surface of the interlayer insulating film 36. In FIG. 2, a surface (lower surface) of the semiconductor substrate 41 in the −Z direction is the front surface of the semiconductor substrate 41, and a surface (upper surface) of the semiconductor substrate 41 in the +Z direction is the back surface of the semiconductor substrate 41.

The second substrate 22 includes a plurality of transistors Tr2. These transistors Tr2 include, for example, pixel transistors such as reset transistors, amplification transistors, and selection transistors. The gate insulating film 42 and the gate electrode 43 of each of the transistors Tr2 are sequentially formed on the front surface of the semiconductor substrate 41. As illustrated in FIG. 2, the gate insulating film 42 and the gate electrode 43 of at least some of the transistors Tr2 may be embedded in a trench formed in the semiconductor substrate 41. The gate insulating film 42 is, for example, a $SiO_2$ film. The gate electrode 43 is, for example, a poly-Si layer. Each of the diffusion regions 41*a* in the semiconductor substrate 41 functions as, for example, a source region or a drain region of any of the transistors Tr2.

The interlayer insulating film 44 is formed on the front surface of the semiconductor substrate 41 and covers the gate electrode 42. The interlayer insulating film 45 is formed on the lower surface of the interlayer insulating film 44. These interlayer insulating films 44 and 45 are, for example, $SiO_2$ films.

The plugs 46*a* to 46*d*, the wiring layers 47*a* to 47*c*, and the pads 48 are formed in the interlayer insulating films 44 and 45. Specifically, the wiring layers 47*a* to 47*c* are sequentially formed below the semiconductor substrate 41. The pads 48 are formed below the wiring layers 47*a* to 47*c*, and are located on the lower surface of the second substrate 22. Each plug 46*a* is a contact plug that electrically connects the diffusion region 41*a* or the gate electrode 42 and the wiring layer 47*a*. Each plug 46*b* is a via plug that electrically connects the wiring layer 47*a* and the wiring layer 47*b*. Each plug 46*c* is a via plug that electrically connects the wiring layer 47*b* and the wiring layer 47*c*. Each plug 46*d* is a via plug that electrically connects the wiring layer 47*c* and any of the pads 48.

The semiconductor substrate 51 is, for example, a Si substrate. The semiconductor substrate 51 is disposed below the interlayer insulating films 44 and 45 with the interlayer insulating films 54 and 55 interposed therebetween. In FIG. 2, a surface (upper surface) of the semiconductor substrate 51 in the +Z direction is the front surface of the semiconductor substrate 51, and a surface (lower surface) of the semiconductor substrate 51 in the −Z direction is the back surface of the semiconductor substrate 51.

The third substrate 23 includes a plurality of transistors Tr3. These transistors Tr3 form, for example, a logic circuit. The gate insulating film 52 and the gate electrode 53 of each of the transistors Tr3 are sequentially formed on the front surface of the semiconductor substrate 51. The gate insulating film 52 is, for example, a $SiO_2$ film. The gate electrode 53 is, for example, a poly-Si layer. Each of the diffusion regions 51*a* in the semiconductor substrate 51 functions as, for example, a source region or a drain region of any of the transistors Tr3.

The interlayer insulating film 54 is formed on the front surface of the semiconductor substrate 51 and covers the gate electrode 52. The interlayer insulating film 55 is formed on the upper surface of the interlayer insulating film 54. These interlayer insulating films 54 and 55 are, for example, $SiO_2$ films. As illustrated in FIG. 2, the interlayer insulating film 55 is bonded to the lower surface of the interlayer insulating film 45.

The plugs 56*a* to 56*c*, the wiring layers 57*a* and 57*b*, and the pads 58 are formed in the interlayer insulating films 54 and 55. Specifically, the wiring layers 57*a* and 57*b* are sequentially formed above the semiconductor substrate 51. The pads 58 are formed above the wiring layers 57*a* and 57*b*, and are located on the upper surface of the third substrate 23. Each plug 56*a* is a contact plug that electrically connects the diffusion region 51*a* or the gate electrode 52 and the wiring layer 57*a*. Each plug 56*b* is a via plug that electrically connects the wiring layer 57*a* and the wiring layer 57*b*. Each plug 56*c* is a via plug that electrically connects the wiring layer 57*b* and any of the pads 58. As illustrated in FIG. 2, the pads 58 are bonded to the lower surfaces of the pads 48 and are electrically connected to the pads 48.

The solid-state imaging device of the present embodiment has a three-layer structure including the first, second, and third substrates 21 to 23. The solid-state imaging device of the present embodiment further includes the filter layer 24 and the on-chip lens layer on the first substrate 21, and includes the through plug 26 in the first and second substrates 21 and 22.

The filter layer 24 includes a plurality of filters including an effect of transmitting light having a predetermined wavelength. For example, the filters for red (R), green (G), and blue (B) are arranged above the photodiodes PD of the red, green, and blue pixels 11, respectively. Moreover, a filter for infrared light may be arranged above the photodiode PD of the pixel 11 for infrared light.

The on-chip lens layer 25 includes a plurality of on-chip lenses including an effect of condensing incident light. In the present embodiment, light incident on each of the on-chip lens is collected by the each of the on-chip lens, transmitted through the corresponding filter, and incident on the corresponding photodiode PD. The photodiode PD converts the light into a charge by photoelectric conversion to generate a signal charge. The generated signal charge is accumulated in the floating diffusion portion 31*c*.

The through plug 26 is formed in the interlayer insulating film 36, the substrate 41, and the interlayer insulating film 44. The through plug 26 is a contact plug that electrically connects the electrode portion 35 and the wiring layer 47*a*. The first substrate 21 and the second substrate 22 of the present embodiment are electrically connected via the through plug 26. On the other hand, the second substrate 22 and the third substrate 23 of the present embodiment are electrically connected via the pads 48 and 58.

Figure 3:
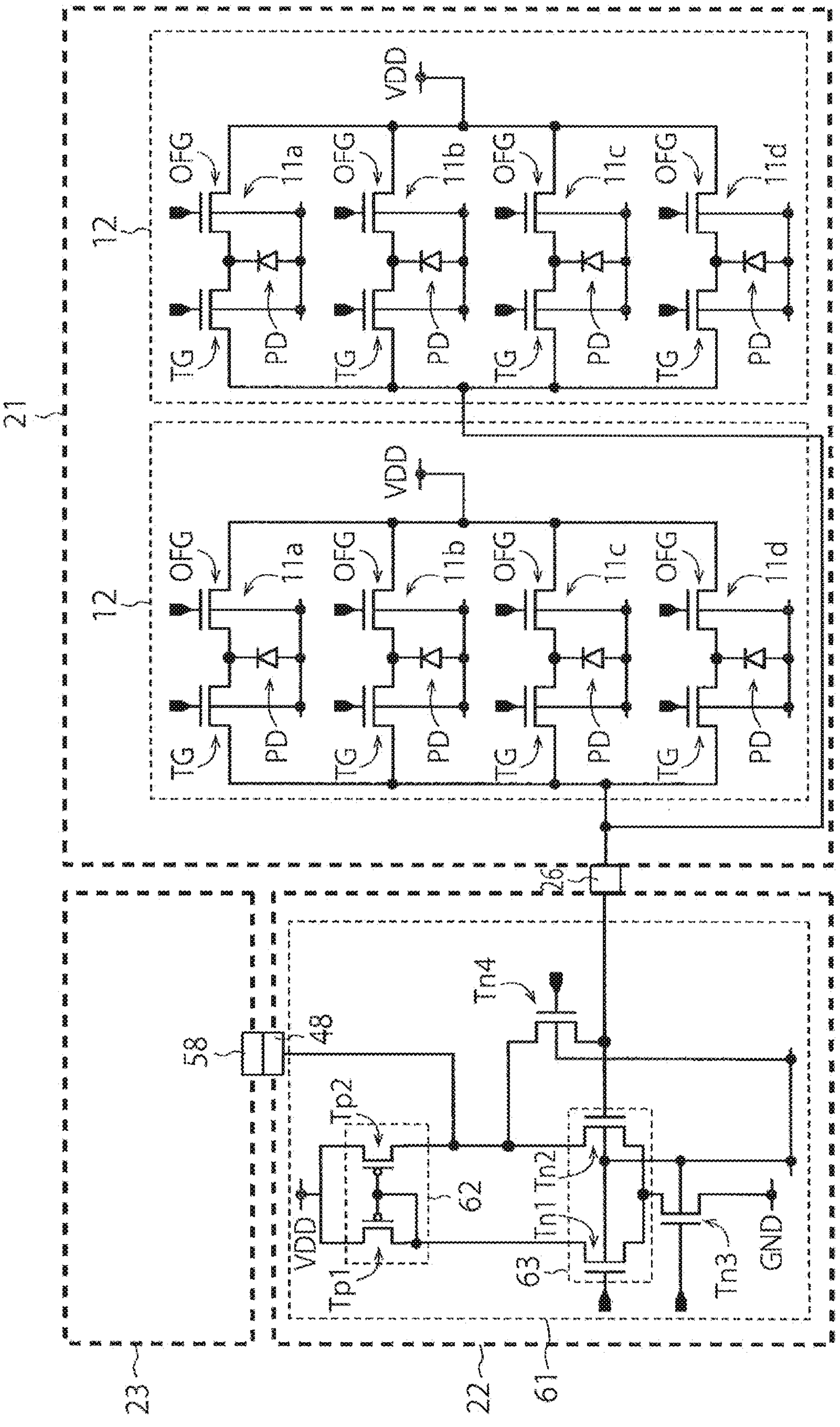
FIG. 3 is a circuit diagram illustrating a configuration of the solid-state imaging device of the first embodiment.

FIG. 3 is a circuit diagram illustrating a configuration of the solid-state imaging device of the first embodiment.

FIG. 3 illustrates the first substrate 21, the second substrate 22, and the third substrate 23. As described above, the first substrate 21 and the second substrate 22 illustrated in FIG. 3 are electrically connected via the through plug 26, and the second substrate 22 and the third substrate 23 illustrated in FIG. 3 are electrically connected via the pads 48 and 58.

As illustrated in FIG. 3, the first substrate 21 includes a photodiode PD for each of the pixels 11. FIG. 3 illustrates photodiodes PD of eight pixels 11*a* to 11*d* in two pixel sharing units 12. A cathode of each of the photodiodes PD is electrically connected to the through plug 26 via a corresponding transfer transistor TG, and is electrically connected to a power supply wiring (VDD) via a corresponding overflow gate transistor OFG. On the other hand, an anode of each of the photodiodes PD is electrically connected to another power supply wiring or a ground wiring. The transfer transistor TG and the overflow gate transistor OFG are included in the above-described transistor Tr1 (FIG. 2).

The second substrate 22 includes a comparator 61. The comparator 61 is included in the AD converter of the above-described column signal processing unit 5 (FIG. 1), compares a pixel signal with a reference signal, and outputs a comparison result of these signals. The comparator 61 includes transistors Tp1 and Tp2 that are p-type MOS transistors and transistors Tn1 to Tn4 that are n-type MOS transistors. These transistors Tp1, Tp2, and Tn1 to Tn4 are included in the above-described transistor Tr2 (FIG. 2). The p-type is an example of a first conductivity type of the present disclosure, and the n-type is an example of a second conductivity type of the present disclosure.

The transistors Tp1 and Tp2 form an active load circuit 62. The gate of the transistor Tp1 is electrically connected to a gate of the transistor Tp2. The sources of the transistors Tp1 and Tp2 are electrically connected to a power supply wiring (VDD). The drain of the transistor Tp1 is electrically connected to the drain of the transistor Tn1 and gates of the transistors Tp1 and Tp2. The drain of the transistor Tp2 is electrically connected to the drains of the transistors Tn2 and Tn4 and the pad 48. The active load circuit 62 is a current mirror circuit that causes current corresponding to a mirror ratio to flow through the transistors Tp1 and Tp2. The transistors Tp1 and Tp2 are examples of a first transistor of the present disclosure.

The transistors Tn1 and Tn2 form a differential pair circuit 63. The gate of the transistor (reference transistor) Tn1 is electrically connected to a wiring for a reference signal. The gate of the transistor (input transistor) Tn2 is electrically connected to a wiring for an image signal (through plug 26) and is electrically connected to the source of the transistor Tn4. The sources of the transistors Tn1 and Tn2 are electrically connected to the drain of the transistor Tn3. The differential pair circuit 63 outputs a comparison result (voltage difference) between an image signal and a reference signal to a node between the transistor Tp2 and the transistor Tn2, and outputs the comparison result from the node to the pad 48. The transistors Tn1 and Tn2 are examples of a second transistor of the present disclosure.

The transistor Tn3 functions as a current source. The gate of the transistor Tn3 is electrically connected to a wiring for applying predetermined voltage. The source of the transistor Tn3 is electrically connected to a ground wiring (GND). This current source maintains the entire current flowing through the transistors Tn1 and Tn2 at a predetermined value.

The transistor Tn4 is disposed between the through plug 26 and the node described above, and functions as an AZ transistor. The gate of the transistor Tn4 is electrically connected to a wiring for a reset signal. The source of the transistor Tn4 is electrically connected to the through plug 26. The drain of the transistor Tn4 is electrically connected to the node described above. The AZ transistor causes the through plug 26 (floating diffusion portion 31*c*) to conduct electricity to the node described above before detecting an output signal, and performs an auto-zero operation.

In the following description, each of the transistors Tp1 and Tp2 in the active load circuit 62 is also referred to as "transistor Tp", and each of the transistors Tn1 and Tn2 in the differential pair circuit 63 is also referred to as "transistor Tn". In the present embodiment, the transconductance of the transistor Tp is set to be smaller than the transconductance of the transistor Tn.

FIG. 4 is formulas for describing characteristics of the solid-state imaging device of the first embodiment.

A of FIG. 4 illustrates a formula of noise (random noise RN) generated in the solid-state imaging device of the present embodiment. The reference sign $gm_p$ represents the transconductance of the transistor Tp in the active load circuit 62, and the reference sign $gm_n$ represents the transconductance of the transistor Tn in the differential pair circuit 63.

B of FIG. 4 is a formula representing the transconductance $gm_n$ illustrated in A of FIG. 4. The transconductance $gm_p$ of the transistor Tp in the active load circuit 62 and the transconductance $gm_n$ of the transistor In in the differential pair circuit 63 are given by this formula. The reference sign $I_D$ represents drain current of the transistor.

In the present embodiment, the sizes of the transistors Tp1, Tp2, Tn1, and Tn2 are set to the same size. Specifically, the gate lengths of the transistors Tp1, Tp2, Tn1, and Tn2 are set to the same value, and the gate widths of the transistors Tp1, Tp2, Tn1, and Tn2 are set to the same value. On the other hand, the transconductance $gm_p$ of the transistor Tp is set to be smaller than the transconductance $gm_n$ of the transistor Tn ($gm_p<gm_n$). As a result, the random noise RN illustrated in A of FIG. 4 can be made smaller than that in the case of $gm_p=gm_n$.

According to the present embodiment, it is possible to reduce noise of the solid-state imaging device without making sizes of the transistors Tp1, Tp2, Tn1, and Tn2 different from each other. Therefore, according to the present embodiment, it is possible to achieve both miniaturization of the transistors such as the transistors Tp1, Tp2, Tn1, and Tn2 and reduction of noise of the solid-state imaging device. In other words, according to the present embodiment, it is possible to miniaturize the transistors while reducing noise of the solid-state imaging device.

In the present embodiment, the transconductance of the transistor Tp1 is set to be the same as the transconductance of the transistor Tp2, the transconductance of the transistor Tn1 is set to be the same as the transconductance of the transistor Tn2, and the transconductance of the transistors Tp1 and Tp2 is set to be smaller than the transconductance of the transistors Tn1 and Tn2. However, the transconductance of the transistor Tp1 may be set to a value different from the transconductance of the transistor Tp2. Furthermore, the transconductance of the transistor Tn1 may be set to a value different from the transconductance of the transistor Tn2.

Figure 5:
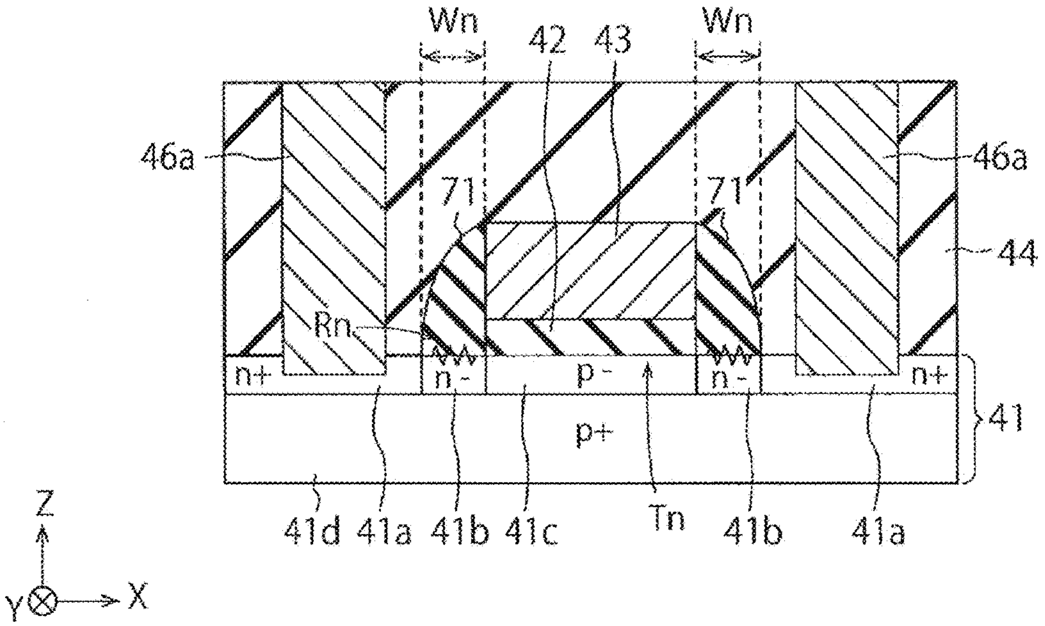
FIG. 5 is cross-sectional views illustrating structures of the solid-state imaging device of the first embodiment.
Figure 5:
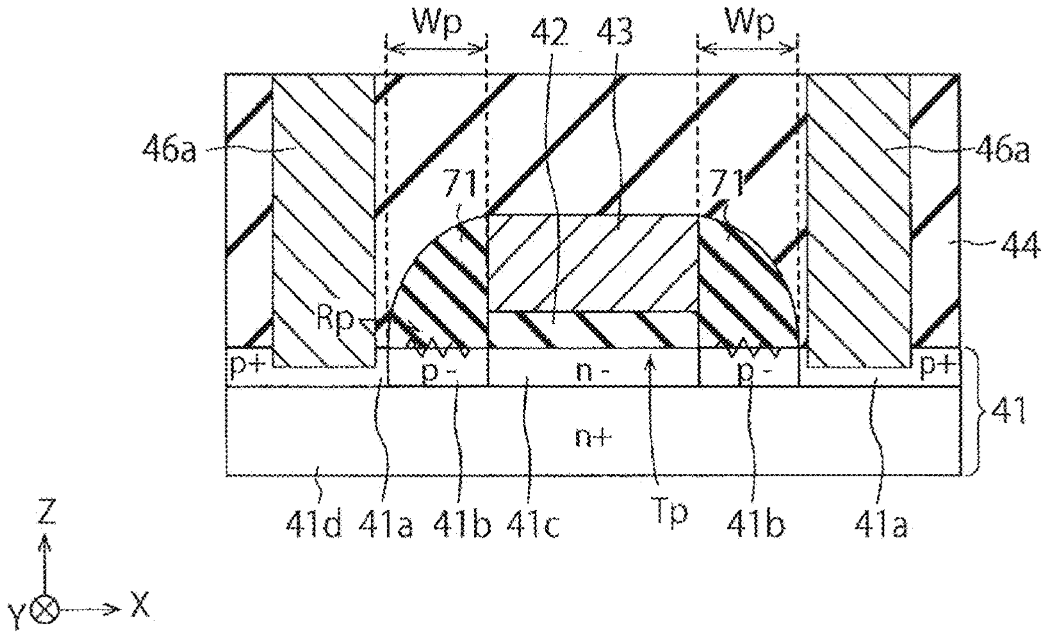

FIG. 5 is cross-sectional views illustrating structures of the solid-state imaging device of the first embodiment.

A of FIG. 5 illustrates a vertical cross section of the transistor Tn. B of FIG. 5 illustrates a vertical cross section of the transistor Tp. However, the orientation of the solid-state imaging device illustrated in A and B of FIG. 5 is opposite to the orientation of the solid-state imaging device illustrated in FIG. 2 for easy understanding of the description. Therefore, in A and B of FIG. 5, the surface (upper surface) of the semiconductor substrate 41 in the +Z direction is the front surface of the semiconductor substrate 31, and the surface (lower surface) of the semiconductor substrate 41 in the −Z direction is the back surface of the semiconductor substrate 31.

In A of FIG. 5, the transistor Tn includes the gate insulating film 42 and the gate electrode 43 sequentially formed on the semiconductor substrate 41, and sidewall insulating films 71 formed on both side surfaces of the gate electrode 43. The sidewall insulating films 71 are, for example, $SiO_2$ films. The gate electrode 43 and the sidewall insulating films 71 are covered with the interlayer insulating film 44. This similarly applies to the sidewall insulating films 71 of the transistor Tp illustrated in B of FIG. 5.

A of FIG. 5 further illustrates a plurality of diffusion regions 41*a*, a plurality of diffusion regions 41*b*, a diffusion region 41*c*, and a diffusion region 41*d* formed in the semiconductor substrate 41. The diffusion regions 41*a* are formed so as to sandwich the gate electrode 43 and the sidewall insulating films 71, and function as a source region and a drain region of the transistor Tn. The diffusion regions 41*b* are formed under the sidewall insulating films 71 so as to sandwich the gate electrode 43, and function as lightly doped drain (LDD) regions on the source region side and the drain region side of the transistor Tn. The diffusion region 41*c* is formed under the gate insulating film 42 and the gate electrode 43. The diffusion region 41*d* is formed under the diffusion regions 41*a* to 41*c*. This similarly applies to the diffusion regions 41*a* to 41*d* of the transistor Tp illustrated in B of FIG. 5. However, the diffusion regions 41*a* to 41*d* illustrated in A of FIG. are n+ type, n-type, p-type, and p+ type, respectively. On the other hand, the diffusion regions 41*a* to 41*d* illustrated in B of FIG. 5 are p+ type, p-type, n-type, and n+ type, respectively.

A of FIG. 5 further illustrates two plugs (contact plugs) 46*a* of the transistor Tn. One of the plugs 46*a* is formed on the diffusion region 41*a* that functions as the source region. The other of the plugs 46*a* is formed on the diffusion region 41*a* that functions as the drain region. This similarly applies to two plugs (contact plugs) 46*a* of the transistor Tp illustrated in B of FIG. 5.

Next, the transistor In illustrated in A of FIG. 5 is compared with the transistor Tp illustrated in B of FIG. 5. The transistor Tp illustrated in B of FIG. 5 is an example of the first transistor of the present disclosure. The transistor In illustrated in A of FIG. 5 is an example of the second transistor of the present disclosure.

A of FIG. 5 illustrates widths Wn in the X direction of the respective diffusion regions 41*b* of the transistor Tn. In the present embodiment, the width Wn of each of the diffusion regions 41*b* of the transistor Tn is the same as the film thickness of each of the sidewall insulating films 71 of the transistor Tn. The reason is that the diffusion regions 41*b* are formed by ion implantation using the gate electrode 43 as a mask, and the diffusion regions 41*a* are then formed in the diffusion regions 41*b* by ion implantation using the sidewall insulating films 71 as masks. In a case where the diffusion regions 41*a* are formed in the diffusion regions 41*b*, regions not covered with the sidewall insulating films 71 are changed to the diffusion regions 41*a*, and regions covered with the sidewall insulating films 71 remain as the diffusion regions 41*b*. In A of FIG. 5, the width Wn of the diffusion region 41*b* on the left side is the same as the film thickness of the sidewall insulating film 71 on the left side, and the width Wn of the diffusion region 41*b* on the right side is the same as the film thickness of the sidewall insulating film 71 on the right side. The width Wn of the diffusion region 41*b* on the left side and the width Wn of the diffusion region 41*b* on the right side may be the same or different. The film thickness of each of the sidewall insulating films 71 of the present embodiment is the width in the X direction of each of the sidewall insulating films 71 on the lower surface of each of the sidewall insulating films 71.

This similarly applies to the transistor Tp illustrated in B of FIG. 5. B of FIG. 5 illustrates widths Wp in the X direction of the respective diffusion regions 41*b* of the transistor Tp. In the present embodiment, the width Wp of each of the diffusion regions 41*b* of the transistor Tp is the same as the film thickness of each of the sidewall insulating films 71 of the transistor Tp. In B of FIG. 5, the width Wp of the diffusion region 41*b* on the left side is the same as the film thickness of the sidewall insulating film 71 on the left side, and the width Wp of the diffusion region 41*b* on the right side is the same as the film thickness of the sidewall insulating film 71 on the right side. The width Wp of the diffusion region 41*b* on the left side and the width Wp of the diffusion region 41*b* on the right side may be the same or different.

In the present embodiment, the film thickness of each of the sidewall insulating films 71 of the transistor Tp is thicker than the film thickness of each of the sidewall insulating films 71 of the transistor Tn, and the width Wp of each of the diffusion regions 41*b* of the transistor Tp is wider than the width Wn of each of the diffusion regions 41*b* of the transistor Tn. As a result, the area of each of the diffusion regions 41*b* of the transistor Tp is larger than the area of each of the diffusion regions 41*b* of the transistor In in plan view. More specifically, the areas of the diffusion regions 41*b* on the source region side and the drain region side of the transistor Tp are larger than the areas of the diffusion regions 41*b* on the source region side and the drain region side of the transistor In, respectively.

A and B of FIG. 5 illustrate the resistance Rn in each of the diffusion regions 41*b* of the transistor Tn and the resistance Rp in each of the diffusion regions 41*b* of the transistor Tp. In the present embodiment, by the area (parasitic resistance area) of each of the diffusion regions 41*b* of the transistor Tp being increased, the resistance Rp (access resistance) becomes higher, the drain current $I_D$ of the transistor Tp becomes smaller (B of FIG. 4), and the transconductance $gm_p$ of the transistor Tp becomes smaller. On the other hand, the transconductance $gm_n$ of the transistor Tn becomes larger. As a result, the random noise RN of the solid-state imaging device can be made smaller than that in the case of $gm_p = gm_n$ (A of FIG. 4).

As described above, in the present embodiment, the area of each of the diffusion regions 41*b* of the transistor Tp is set to be larger than the area of each of the diffusion regions 41*b* of the transistor Tn. Therefore, according to the present embodiment, it is possible to reduce noise of the solid-state imaging device in a suitable manner, such as making it easier to achieve both miniaturization of the transistors and reduction of noise of the solid-state imaging device.

Second Embodiment

Figure 6:
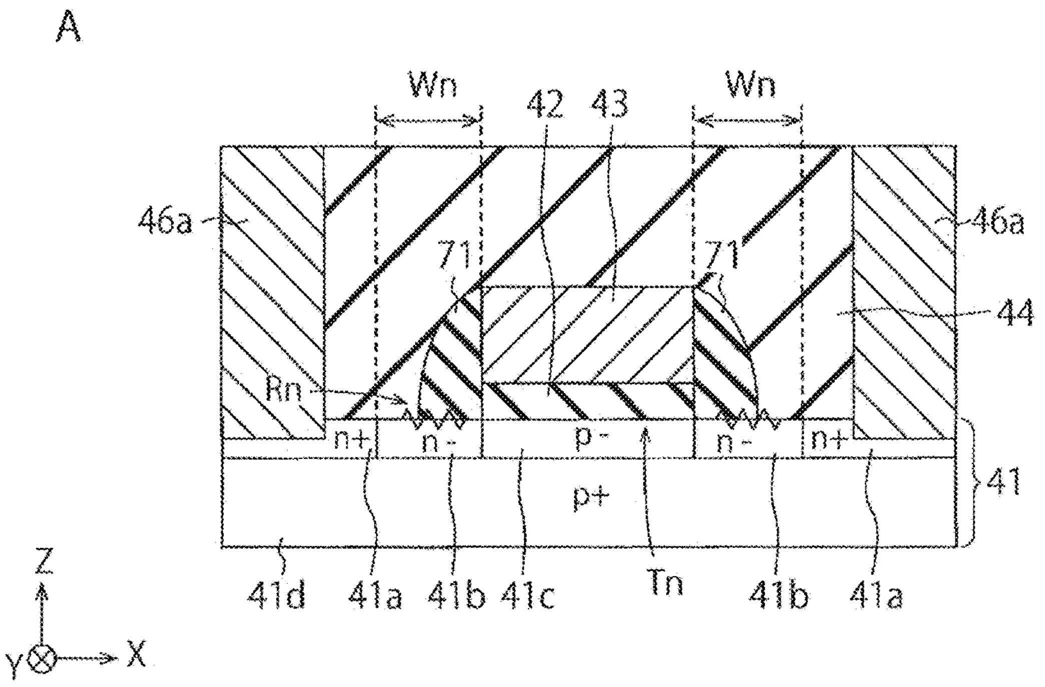
FIG. 6 is cross-sectional views illustrating structures of a solid-state imaging device of a second embodiment.
Figure 6:
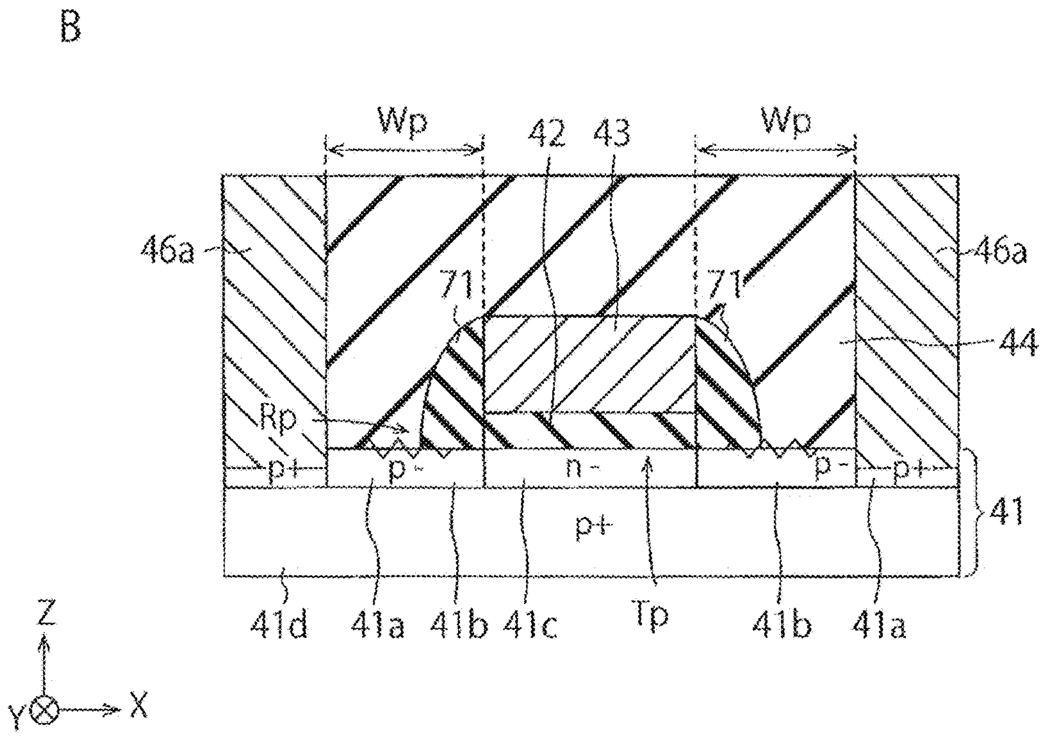

FIG. 6 is cross-sectional views illustrating structures of a solid-state imaging device according to a second embodiment.

A and B of FIG. 6 illustrate vertical sections of transistors Tn and Tp, respectively, similarly to A and B of FIG. 5.

The structures of the transistors Tn and Tp of the present embodiment are substantially similar to the structures of the transistors Tn and Tp of the first embodiment, respectively. However, the width Wn of each of diffusion regions 41*b* of the transistor Tn of the present embodiment is different from the film thickness of each of sidewall insulating films 71 of the transistor Tn, and is, for example, wider than the film thickness of each of the sidewall insulating films 71 of the transistor Tn. The reason is that the diffusion regions 41*b* are formed by ion implantation using a gate electrode 43 as a mask, and diffusion regions 41*a* are then formed in the diffusion regions 41*b* by ion implantation using films other than the sidewall insulating films 71 as masks. Next, mask films are removed, and then the sidewall insulating films 71 are formed. Similarly, the width Wp of each of the diffusion regions 41*b* of the transistor Tp of the present embodiment is different from the film thickness of each of sidewall insulating films 71 of the transistor Tp, and is, for example, wider than the film thickness of each of sidewall insulating films 71 of the transistor Tp. In the present embodiment, the film thickness of each of the sidewall insulating films 71 of the transistor Tn is the same as the film thickness of each of the sidewall insulating films 71 of the transistor Tp.

Also in the present embodiment, the width Wp of each of the diffusion regions 41*b* of the transistor Tp is wider than the width Wn of each of the diffusion regions 41*b* of the transistor Tn. As a result, the area of each of the diffusion regions 41*b* of the transistor Tp is larger than the area of each of the diffusion regions 41*b* of the transistor Tn in plan view. As a result, the transconductance $gm_p$ of the transistor Tp can be made smaller, the transconductance $gm_n$ of the transistor Tn can be made larger, and the random noise RN of the solid-state imaging device can be made smaller.

According to the present embodiment, it is possible to reduce noise of the solid-state imaging device in a suitable manner, similarly to the first embodiment. However, the first embodiment has an advantage that the number of steps of manufacturing the solid-state imaging device can be reduced by using the sidewall insulating films 71 as masks. On the other hand, the present embodiment has an advantage that the film thicknesses of the sidewall insulating films 71 of the transistors Tp and Tn can be unified, and an advantage that noise of the solid-state imaging device can be reduced even in a case where the film thickness of the sidewall insulating films 71 cannot be increased.

Third Embodiment

Figure 7:
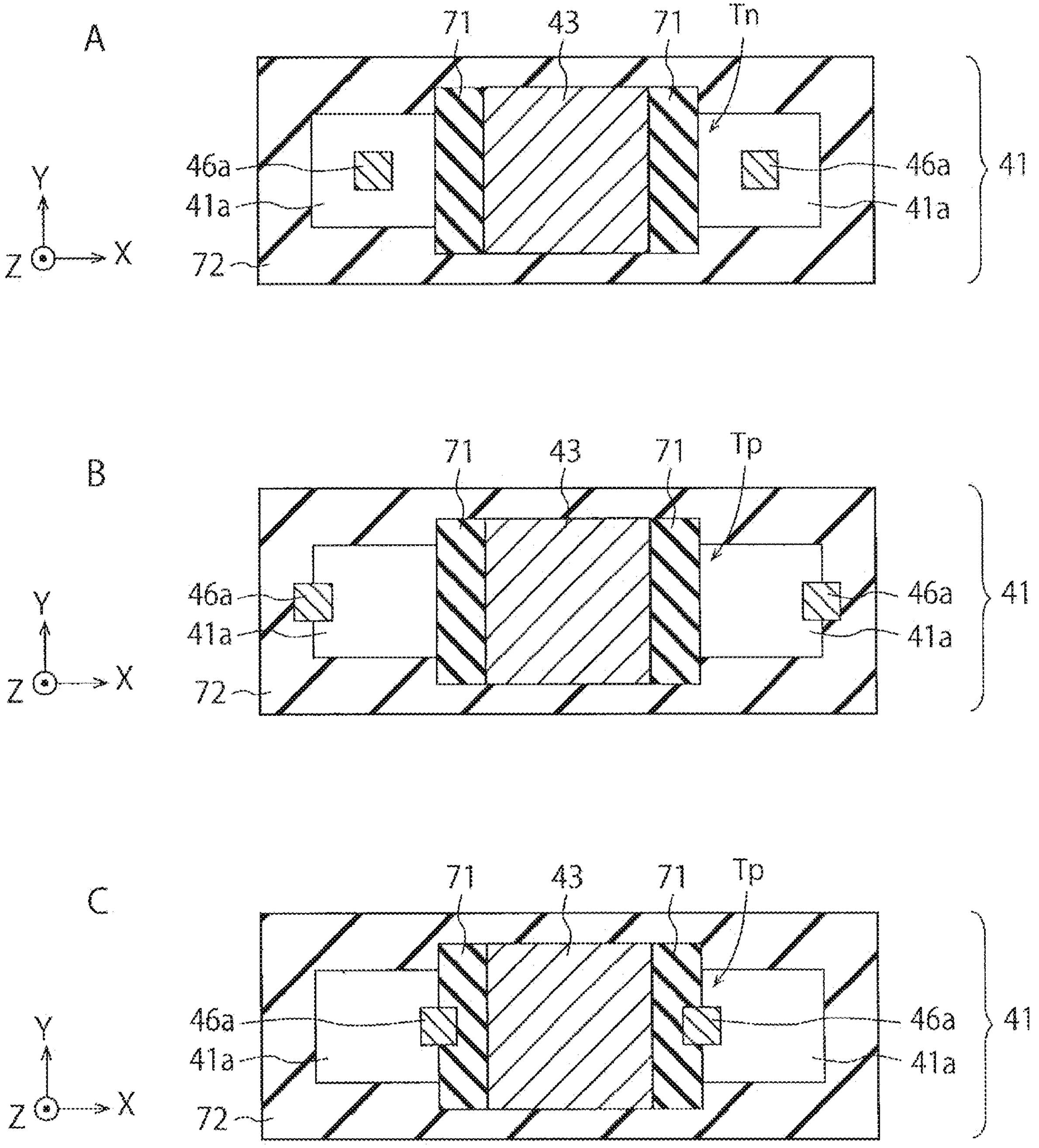
FIG. 7 is plan views illustrating structures of a solid-state imaging device of a third embodiment.

FIG. 7 is plan views illustrating structures of a solid-state imaging device according to a third embodiment.

A and B of FIG. 7 illustrate planar structures of transistors Tn and Tp of the present embodiment, respectively. C of FIG. 7 illustrates a planar structure of the transistor Tp according to a modification of the present embodiment. The orientation of the solid-state imaging device illustrated in A to C of FIG. 7 is opposite to the orientation of the solid-state imaging device illustrated in FIG. 2 for easy understanding of the description. Therefore, in A to C of FIG. 7, a surface (upper surface) of a semiconductor substrate 41 in the +Z direction is the front surface of a semiconductor substrate 31, and a surface (lower surface) of the semiconductor substrate 41 in the −Z direction is the back surface of the semiconductor substrate 31.

A of FIG. 7 illustrates a gate electrode 43, sidewall insulating films 71, and diffusion region 41*a* of the transistor Tn of the present embodiment. One of the diffusion regions 41*a* functions as a source region of the transistor Tn, and the other diffusion region 41*a* functions as a drain region of the transistor Tn. A of FIG. 7 further illustrates plugs (contact plugs) 46*a* formed on these diffusion regions 41*a*, and an element isolation insulating film 72 formed in the semiconductor substrate 41 so as to surround these diffusion regions 41*a* in plan view. The element isolation insulating film 72 is, for example, a $SiO_2$ film. This similarly applies to the transistor Tp of the present embodiment illustrated in B of FIG. 7 and the transistor Tp of the modification of the present embodiment illustrated in B of FIG. 7.

Next, the transistor Tn illustrated in A of FIG. 7 is compared with the transistor Tp illustrated in B of FIG. 7.

A of FIG. 7 illustrates one plug 46*a* formed on the diffusion region 41*a* on the left side and one plug 46*a* formed on the diffusion region 41*a* on the right side. In A of FIG. 7, the shape and area of the diffusion region 41*a* on the left side in plan view are the same as the shape and area of the diffusion region 41*a* on the right side, and the shape and area of the plug 46*a* on the left side in plan view are the same as the shape and area of the plug 46*a* on the right side. In A of FIG. 7, the diffusion region 41*a* on the left side is, for example, a source region, and the diffusion region 41*a* on the right side is, for example, a drain region.

B of FIG. 7 also illustrates one plug 46*a* formed on the diffusion region 41*a* on the left side and one plug 46*a* formed on the diffusion region 41*a* on the right side. In B of FIG. 7, the shape and area of the diffusion region 41*a* on the left side in plan view are the same as the shape and area of the diffusion region 41*a* on the right side, and the shape and area of the plug 46*a* on the left side in plan view are the same as the shape and area of the plug 46*a* on the right side. In B of FIG. 7, the diffusion region 41*a* on the left side is, for example, a source region, and the diffusion region 41*a* on the right side is, for example, a drain region.

Furthermore, the shape and area of each of the diffusion regions 41*a* illustrated in A of FIG. 7 are the same as the shape and area of each of the diffusion regions 41*a* illustrated in B of FIG. 7, and the shape and area of each of the plugs 46*a* illustrated in A of FIG. 7 are the same as the shape and area of each of the plugs 46*a* illustrated in B of FIG. 7.

However, each of the plugs 46*a* illustrated in A of FIG. 7 is located only on the diffusion region 41*a*, and is not located on the element isolation insulating film 72. On the other hand, each of the plugs 46*a* illustrated in B of FIG. 7 is located on the diffusion region 41*a* and the element isolation insulating film 72. That is, a part of each of the plugs 46*a* illustrated in B of FIG. 7 is located on the element isolation insulating film 72. Therefore, the contact area between each of the plugs 46*a* illustrated in B of FIG. 7 and the diffusion region 41*a* is smaller than the contact area between each of the plugs 46*a* illustrated in A of FIG. 7 and the diffusion region 41*a*. As a result, the contact resistance between each of the plugs 46*a* illustrated in B of FIG. 7 and the diffusion region 41*a* is higher than the contact resistance between each of the plugs 46*a* illustrated in A of FIG. 7 and the diffusion region 41*a*.

Therefore, according to the present embodiment, the transconductance $gm_p$ of the transistor Tp can be made smaller and the transconductance $gm_n$ of the transistor Tn can be made larger, similarly to the first embodiment. As a result, the random noise RN of the solid-state imaging device of the present embodiment can be made smaller.

The structure illustrated in B of FIG. 7 may be replaced with the structure illustrated in C of FIG. 7. Each of the plugs 46*a* illustrated in C of FIG. 7 is located on the diffusion region 41*a* and the sidewall insulating film 71. That is, a part of each of the plugs 46*a* illustrated in C of FIG. 7 is located on the sidewall insulating film 71. Therefore, the contact area between each of the plugs 46*a* illustrated in C of FIG. 7 and the diffusion region 41*a* is smaller than the contact area between each of the plugs 46*a* illustrated in A of FIG. 7 and the diffusion region 41*a*. As a result, the random noise RN of the solid-state imaging device of the present modification can be made smaller.

According to the present embodiment, it is possible to reduce noise of the solid-state imaging device in a suitable manner, similarly to the first and second embodiments. Note that the solid-state imaging device of the present embodiment may include a plurality of plugs 46*a* on each of the diffusion regions 41*a*. In this case, the total contact area between each of the diffusion regions 41*a* illustrated in B or C of FIG. 7 and all plugs 46*a* thereon is set to be smaller than the total contact area between each of the diffusion regions 41*a* illustrated in A of FIG. 7 and all plugs 46*a* thereon. Furthermore, the source region and the drain region of each of the transistors (Tp, Tn) may have the same shape and area, or may have different shapes and/or areas.

Fourth Embodiment

Figure 8:
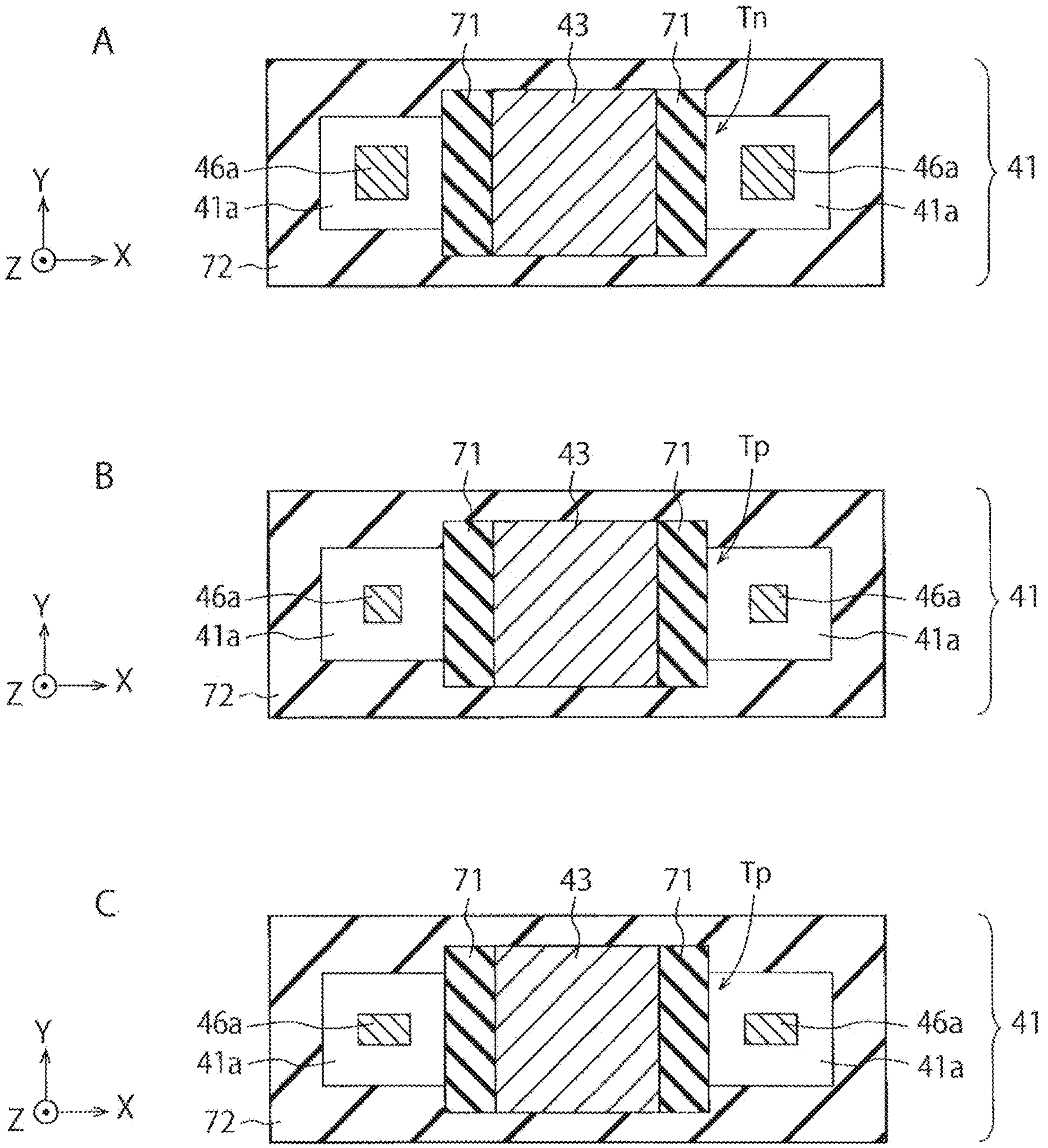
FIG. 8 is plan views illustrating structures of a solid-state imaging device of a fourth embodiment.

FIG. 8 is plan views illustrating structures of a solid-state imaging device according to a fourth embodiment.

A and B of FIG. 8 illustrate planar structures of transistors Tn and Tp of the present embodiment, respectively. C of FIG. 8 illustrates a planar structure of the transistor Tp according to a modification of the present embodiment.

The structures of the transistors Tn and Tp of the present embodiment illustrated A and B of FIG. 8 are substantially similar to the structures of the transistors Tn and Tp of the third embodiment, respectively. However, each of plugs 46*a* illustrated in A and B of FIG. 8 is located only on a diffusion region 41*a*, and is not located on a sidewall insulating film 71 or an element isolation insulating film 72. Furthermore, in a plan view, the area of each of the plugs 46*a* illustrated in B of FIG. 8 is smaller than the area of each of the plugs 46*a* illustrated in A of FIG. 8. Therefore, the contact area between each of the plugs 46*a* illustrated in B of FIG. 8 and the diffusion region 41*a* is smaller than the contact area between each of the plugs 46*a* illustrated in A of FIG. 8 and the diffusion region 41*a*. As a result, the contact resistance between each of the plugs 46*a* illustrated in B of FIG. 8 and the diffusion region 41*a* is higher than the contact resistance between each of the plugs 46*a* illustrated in A of FIG. 8 and the diffusion region 41*a*.

Therefore, according to the present embodiment, the transconductance $gm_p$ of the transistor Tp can be made smaller and the transconductance $gm_n$ of the transistor Tn can be made larger, similarly to the first embodiment. As a result, the random noise RN of the solid-state imaging device of the present embodiment can be made smaller.

The structure illustrated in B of FIG. 8 may be replaced with the structure illustrated in C of FIG. 8. The area of each of the plugs 46*a* illustrated in C of FIG. 8 is also smaller than the area of each of the plugs 46*a* illustrated in A of FIG. 8. However, the planar shape (square) of each of the plugs 46*a* illustrated in B of FIG. 8 is similar to the planar shape (square) of each of the plugs 46*a* illustrated in A of FIG. 8, whereas the planar shape (rectangle) of each of the plugs 46*a* illustrated in C of FIG. 8 is not similar to the planar shape (square) of each of the plugs 46*a* illustrated in A of FIG. 8. According to the present modification, the random noise RN of the solid-state imaging device can be made smaller, similarly to the present embodiment.

The planar shape of each of the plugs 46*a* may be any shape. For example, the planar shape of each of the plugs 46*a* of the transistors Tn and Tp may be a circle. In this case, if the diameter of the circle that is the planar shape of each of the plugs 46*a* of the transistor Tp is set to be smaller than the diameter of the circle that is the planar shape of each of the plugs 46*a* of the transistor Tn, the area of each of the plugs 46*a* of the transistor Tp can be set to be smaller than the area of each of the plugs 46*a* of the transistor Tn.

According to the present embodiment, it is possible to reduce noise of the solid-state imaging device in a suitable manner, similarly to the first to third embodiments. Note that the solid-state imaging device of the present embodiment may include a plurality of plugs 46*a* on each of the diffusion regions 41*a*. In this case, the total contact area between each of the diffusion regions 41*a* illustrated in B or C of FIG. 8 and all plugs 46*a* thereon is set to be smaller than the total contact area between each of the diffusion regions 41*a* illustrated in A of FIG. 8 and all plugs 46*a* thereon. Furthermore, the source region and the drain region of each of the transistors (Tp, Tn) may have the same shape and area, or may have different shapes and/or areas.

Here, the third embodiment is compared with the fourth embodiment. According to the third embodiment, since it is not necessary to form the plugs 46*a* each having a small area, it is possible to form the plugs 46*a* without using an exposure device capable of highly accurate exposure. According to the fourth embodiment, since it is not necessary to form the plugs 46*a* on the diffusion regions 41*a* and insulating films, it is possible to reduce short-circuiting of the plugs 46*a*.

Fifth Embodiment

Figure 9:
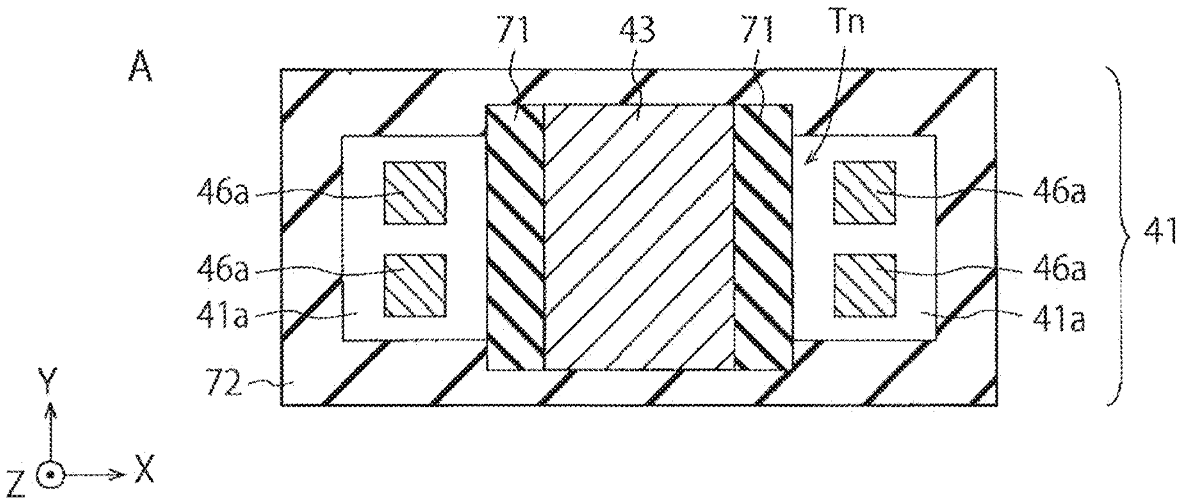
FIG. 9 is plan views illustrating structures of a solid-state imaging device of a fifth embodiment.
Figure 9:
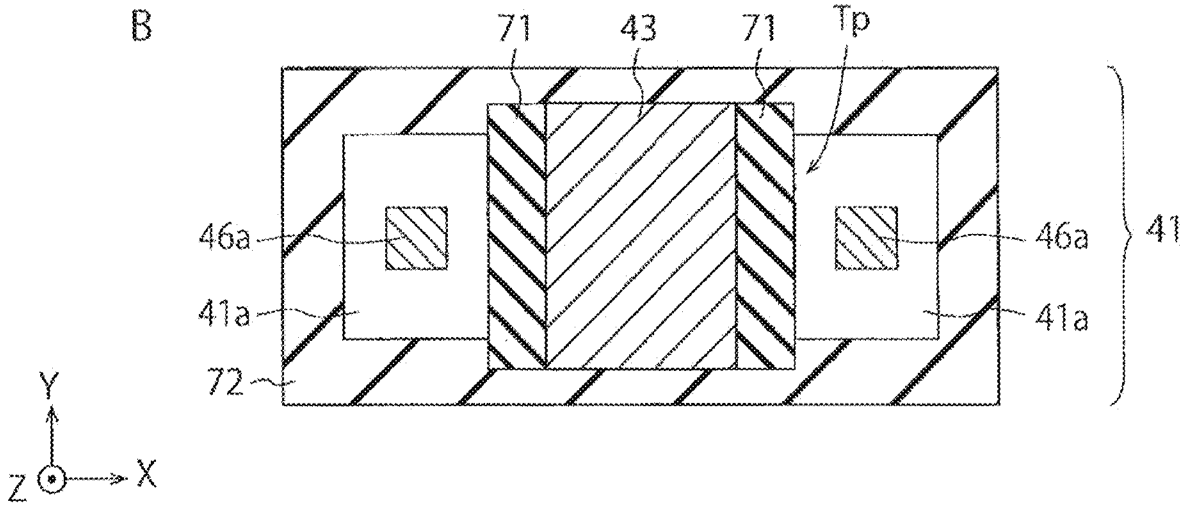

FIG. 9 is plan views illustrating structures of a solid-state imaging device according to a fifth embodiment.

A and B of FIG. 9 illustrate planar structures of transistors Tn and Tp of the present embodiment, respectively.

The structures of the transistors Tn and Tp of the present embodiment illustrated A and B of FIG. 9 are substantially similar to the structures of the transistors Tn and Tp of the third embodiment, respectively. However, each of plugs 46*a* illustrated in A and B of FIG. 9 is located only on a diffusion region 41*a*, and is not located on a sidewall insulating film 71 or an element isolation insulating film 72. Furthermore, the number of plugs 46*a* on each of the diffusion regions 41*a* illustrated in B of FIG. 9 is smaller than the number of plugs 46*a* on each of the diffusion regions 41*a* illustrated in A of FIG. 9. Therefore, the total contact area between each of the diffusion regions 41*a* illustrated in B of FIG. 9 and all plugs 46*a* thereon is smaller than the total contact area between each of the diffusion regions 41*a* illustrated in A of FIG. 9 and all plugs 46*a* thereon. As a result, the contact resistance between each of the diffusion regions 41*a* illustrated in B of FIG. 9 and all plugs 46*a* thereon is higher than the contact resistance between each of the diffusion regions 41*a* illustrated in A of FIG. 9 and all plugs 46*a* thereon.

Therefore, according to the present embodiment, the transconductance $gm_p$ of the transistor Tp can be made smaller and the transconductance $gm_n$ of the transistor Tn can be made larger, similarly to the first embodiment. As a result, the random noise RN of the solid-state imaging device of the present embodiment can be made smaller.

According to the present embodiment, it is possible to reduce noise of the solid-state imaging device in a suitable manner, similarly to the first to fourth embodiments. Note that the plugs 46a illustrated in A and B of FIG. 9 have the same shape and the same area, but may have different shapes and/or different areas. Furthermore, the source region and the drain region of each of the transistors (Tp, Tn) may have the same shape and area, or may have different shapes and/or areas.

Here, the third, fourth, and fifth embodiments are compared. According to the third or fifth embodiment, since it is not necessary to form the plugs 46a each having a small area, it is possible to form the plugs 46a without using an exposure device capable of highly accurate exposure. According to the fourth or fifth embodiment, since it is not necessary to form the plugs 46a on the diffusion regions 41a and insulating films, it is possible to reduce short-circuiting of the plugs 46a.

Application Example

Figure 10:
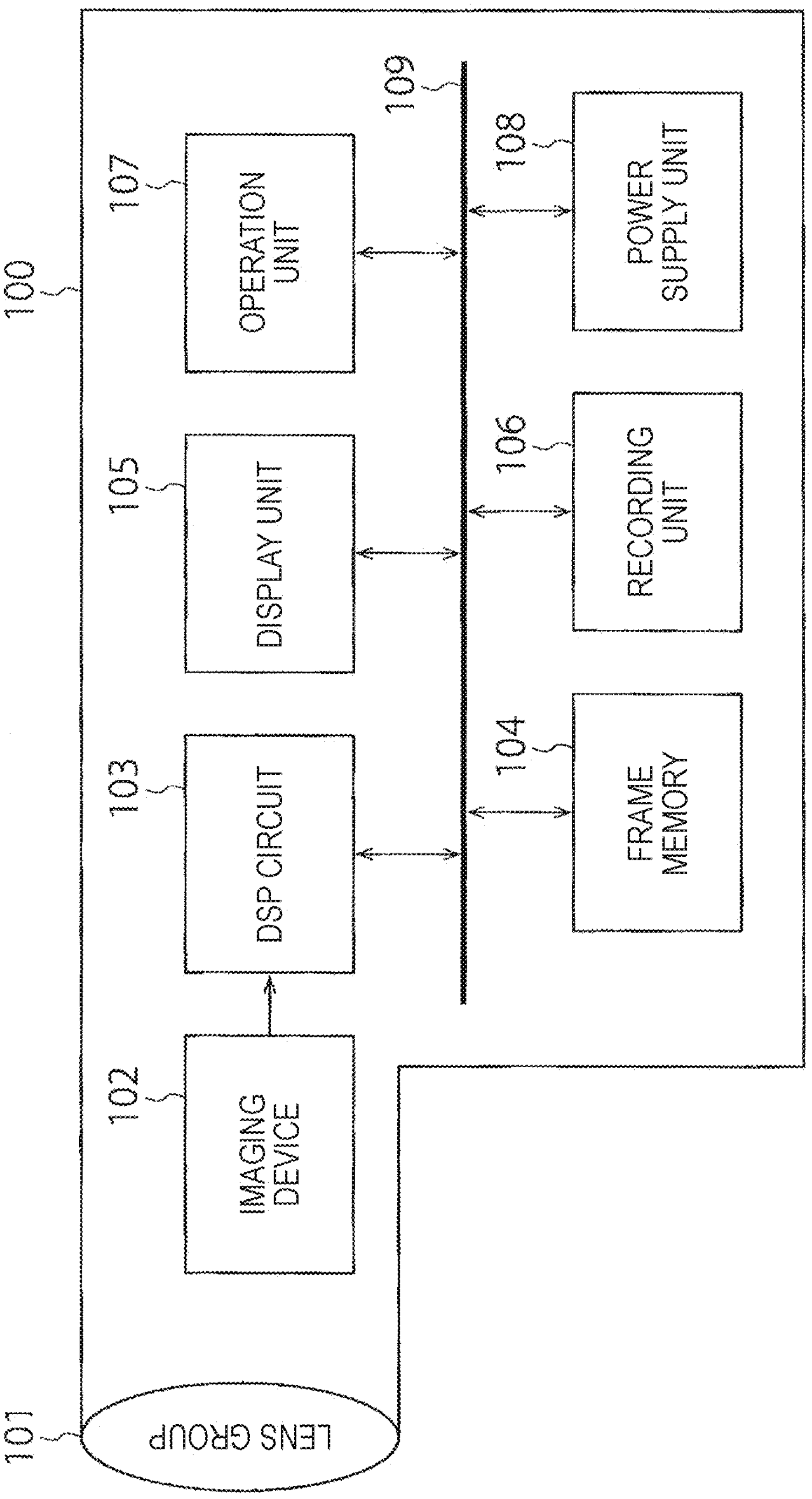
FIG. 10 is a block diagram illustrating a configuration example of an electronic device.

FIG. 10 is a block diagram illustrating a configuration example of an electronic device. The electronic device illustrated in FIG. 10 is a camera 100.

The camera 100 includes an optical unit 101 including a lens group and the like, an imaging device 102 that is the solid-state imaging device according to any of the first to fifth embodiments, a digital signal processor (DSP) circuit 103 that is a camera signal processing circuit, a frame memory 104, a display unit 105, a recording unit 106, an operation unit 107, and a power supply unit 108. Furthermore, the DSP circuit 103, the frame memory 104, the display unit 105, the recording unit 106, the operation unit 107, and the power supply unit 108 are connected to each other via a bus line 109.

The optical unit 101 captures incident light (image light) from a subject and forms an image on an imaging surface of the imaging device 102. The imaging device 102 converts a light amount of incident light formed into an image on the imaging surface by the optical unit 101 into an electric signal on a pixel-by-pixel basis and outputs the electric signal as a pixel signal.

The DSP circuit 103 performs signal processing on the pixel signal output from the imaging device 102. The frame memory 104 is a memory for storing one screen of a moving image or a still image that is obtained by imaging by the imaging device 102.

The display unit 105 includes, for example, a panel type display device such as a liquid crystal panel or an organic EL panel, and displays a moving image or a still image that is obtained by imaging by the imaging device 102. The recording unit 106 records a moving image or a still image that is obtained by imaging by the imaging device 102 on a recording medium such as a hard disk or a semiconductor memory.

The operation unit 107 issues operation commands for various functions of the camera 100 in response to an operation performed by a user. The power supply unit 108 appropriately supplies various power supplies, which are operation power supplies for the DSP circuit 103, the frame memory 104, the display unit 105, the recording unit 106, and the operation unit 107, to these power supply targets.

It can be expected to acquire a satisfactory image by using the solid-state imaging device according to any of the first to fifth embodiments as the imaging device 102.

The solid-state imaging device can be applied to various other products. For example, the solid-state imaging device may be included in any type of mobile bodies such as vehicles, electric vehicles, hybrid electric vehicles, motorcycles, bicycles, personal mobility, airplanes, drones, ships, and robots.

Figure 11:
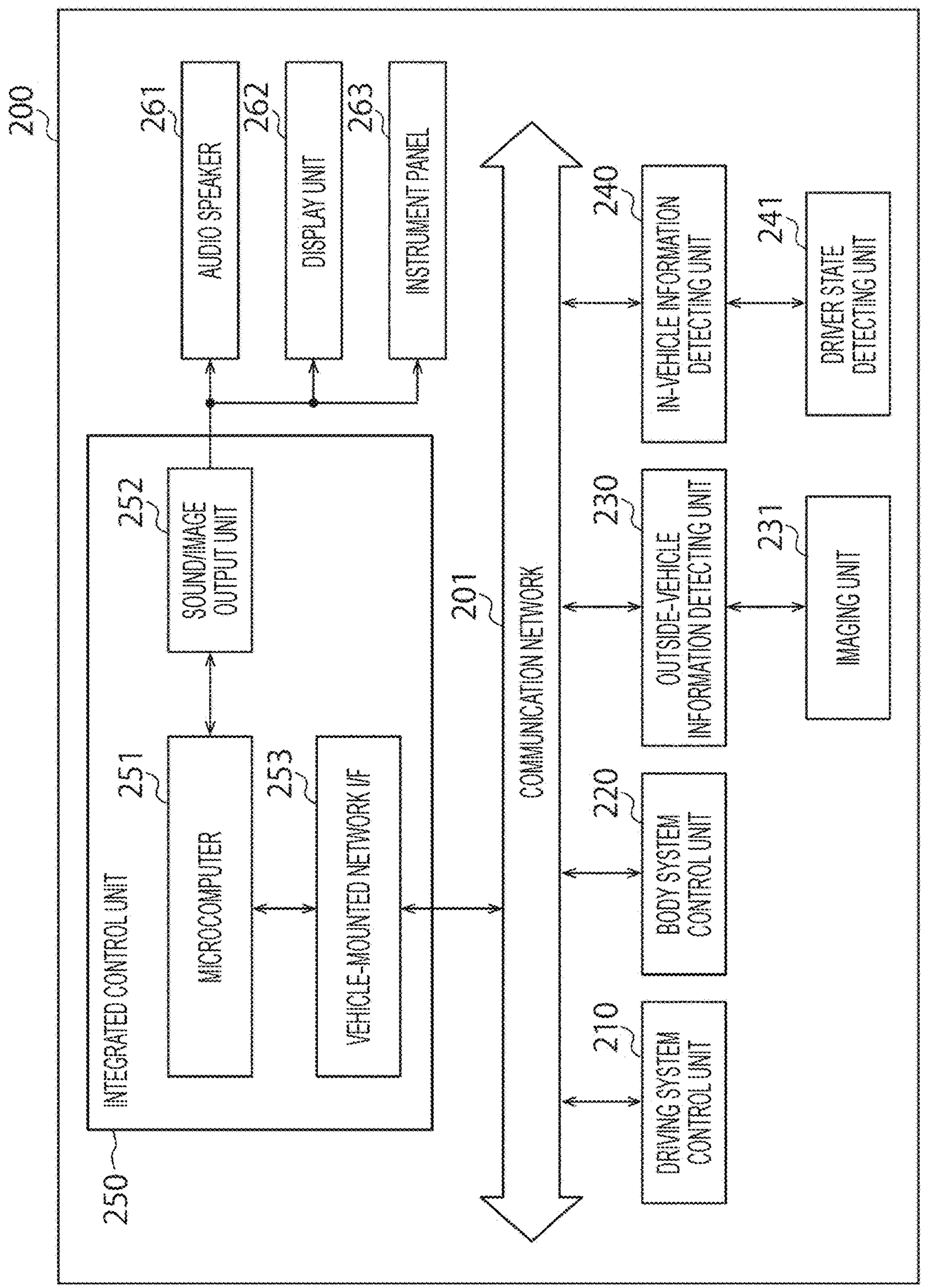
FIG. 11 is a block diagram illustrating a configuration example of a mobile body control system.

FIG. 11 is a block diagram illustrating a configuration example of a mobile body control system. The mobile body control system illustrated in FIG. 11 is a vehicle control system 200.

The vehicle control system 200 includes a plurality of electronic control units connected to each other via a communication network 201. In the example illustrated in FIG. 11, the vehicle control system 200 includes a driving system control unit 210, a body system control unit 220, an outside-vehicle information detecting unit 230, an in-vehicle information detecting unit 240, and an integrated control unit 250. Moreover, FIG. 11 illustrates a microcomputer 251, a sound/image output unit 252, and a vehicle-mounted network interface (I/F) 253 as components of the integrated control unit 250.

The driving system control unit 210 controls the operation of devices related to a driving system of a vehicle in accordance with various types of programs. For example, the driving system control unit 210 functions as a control device for a driving force generating device for generating a driving force of a vehicle, such as an internal combustion engine, a driving motor, or the like, a driving force transmitting mechanism for transmitting the driving force to wheels, a steering mechanism for adjusting a steering angle of the vehicle, a braking device for generating a braking force of the vehicle, and the like.

The body system control unit 220 controls the operation of various types of devices provided to a vehicle body in accordance with various types of programs. For example, the body system control unit 220 functions as a control device for a smart key system, a keyless entry system, a power window device, or various types of lamps (for example, a head lamp, a backup lamp, a brake lamp, a turn signal, a fog lamp, or the like). In this case, radio waves transmitted from a mobile device as an alternative to a key or signals of various types of switches can be input to the body system control unit 220. The body system control unit 220 receives inputs of such radio waves or signals, and controls a door lock device, the power window device, the lamps, or the like of the vehicle.

The outside-vehicle information detecting unit 230 detects information of the outside of the vehicle including the vehicle control system 200. The outside-vehicle information detecting unit 230 is connected with, for example, an imaging unit 231. The outside-vehicle information detecting unit 230 makes the imaging unit 231 obtain by imaging an image of the outside of the vehicle, and receives the image that is obtained by imaging from the imaging unit 231. On the basis of the received image, the outside-vehicle information detecting unit 230 may perform processing of detecting an object such as a human, an automobile, an obstacle, a sign, a character on a road surface, or the like, or processing of detecting a distance thereto.

The imaging unit 231 is an optical sensor that receives light and that outputs an electric signal corresponding to the amount of received light. The imaging unit 231 can output the electric signal as an image, or can output the electric signal as information of a measured distance. The light received by the imaging unit 231 may be visible light, or may be invisible light such as infrared light. The imaging unit 231 includes the solid-state imaging device according to any of the first to fifth embodiments.

The in-vehicle information detecting unit 240 detects information of the inside of the vehicle including the vehicle control system 200. The in-vehicle information detecting unit 240 is, for example, connected with a driver state detecting unit 241 that detects a state of a driver. For example, the driver state detecting unit 241 includes a camera that images the driver, and on the basis of detection information input from the driver state detecting unit 241, the in-vehicle information detecting unit 240 may calculate a degree of fatigue of the driver or a degree of concentration of the driver, or may determine whether or not the driver is dozing off. The camera may include the solid-state imaging device according to any of the first to fifth embodiments, and may be, for example, the camera 100 illustrated in FIG. 10.

The microcomputer 251 can calculate a control target value for the driving force generating device, the steering mechanism, or the braking device on the basis of the information of the inside or outside of the vehicle obtained by the outside-vehicle information detecting unit 230 or the in-vehicle information detecting unit 240, and output a control command to the driving system control unit 210. For example, the microcomputer 251 can perform cooperative control intended for implementing functions of an advanced driver assistance system (ADAS), the functions including collision avoidance or shock mitigation for the vehicle, following traveling based on a following distance, vehicle speed maintaining traveling, a warning of collision of the vehicle, a warning of deviation of the vehicle from a lane, and the like.

Furthermore, the microcomputer 251 can perform cooperative control intended for automated driving or the like in which the vehicle travels autonomously without depending on the operation of the driver by controlling the driving force generating device, the steering mechanism, or the braking device on the basis of the information of the surroundings of the vehicle obtained by the outside-vehicle information detecting unit 230 or the in-vehicle information detecting unit 240.

Furthermore, the microcomputer 251 can output a control command to the body system control unit 220 on the basis of the information of the outside of the vehicle obtained by the outside-vehicle information detecting unit 230. For example, the microcomputer 251 can perform cooperative control intended for preventing glare, such as switching from a high beam to a low beam by controlling the headlamp according to the position of a preceding vehicle or an oncoming vehicle detected by the outside-vehicle information detecting unit 230.

The sound/image output unit 252 transmits an output signal of at least one of a sound or an image to an output device that can visually or auditorily provide information to an occupant of the vehicle or the outside of the vehicle. In the example of FIG. 11, an audio speaker 261, a display unit 262, and an instrument panel 263 are illustrated as such an output device. The display unit 262 may, for example, include an on-board display or a head-up display.

Figure 12:
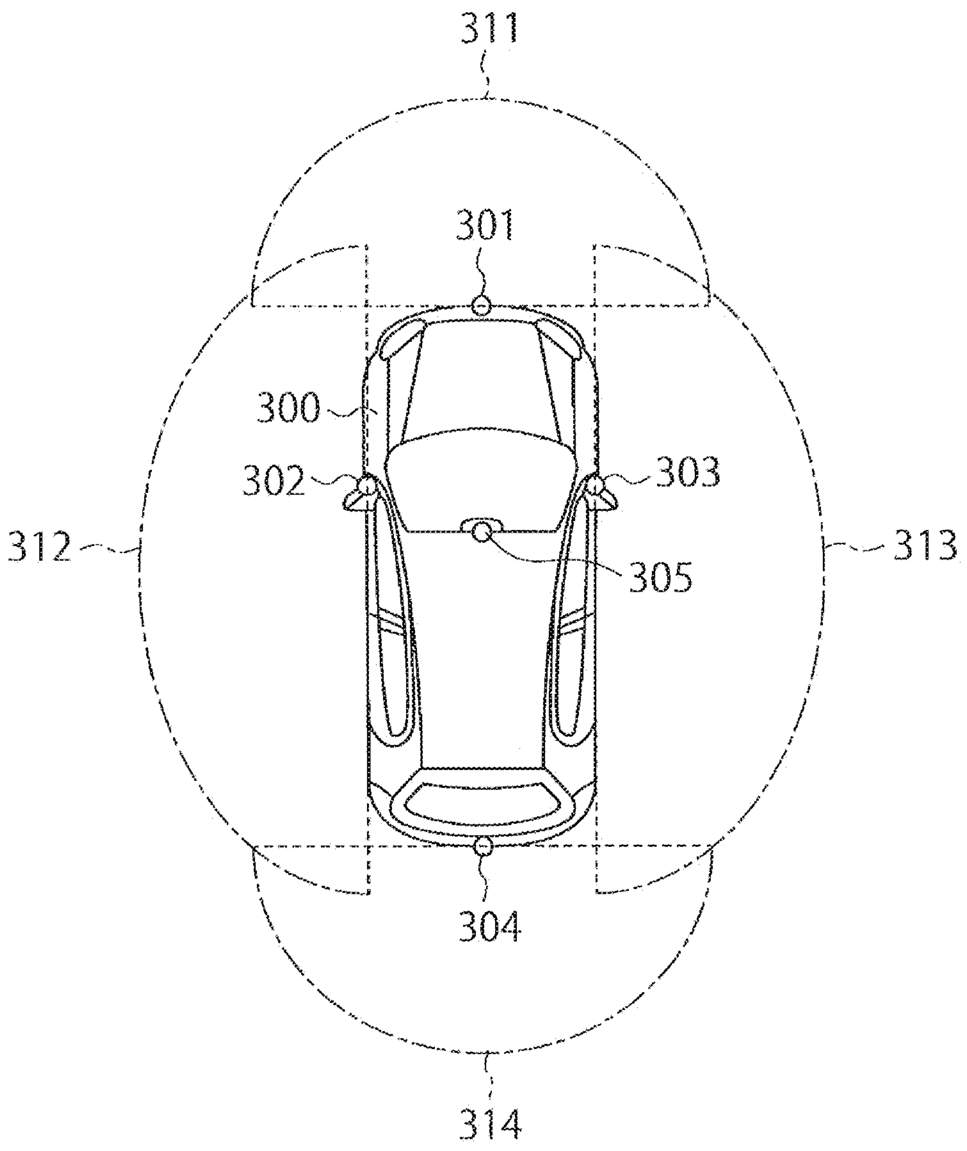
FIG. 12 is a plan view illustrating a specific example of a setting position of an imaging unit in FIG. 11.

FIG. 12 is a plan view illustrating a specific example of a setting position of the imaging unit 231 in FIG. 11.

A vehicle 300 illustrated in FIG. 12 includes imaging units 301, 302, 303, 304, and 305 as the imaging unit 231. The imaging units 301, 302, 303, 304, and 305 are, for example, provided at positions on a front nose, side mirrors, a rear bumper, and a back door of the vehicle 300, and on an upper portion of a windshield in the interior of the vehicle.

The imaging unit 301 provided on the front nose mainly acquires an image of the front of the vehicle 300. The imaging unit 302 provided on the left side mirror and the imaging unit 303 provided on the right side mirror mainly acquire images of the sides of the vehicle 300. The imaging unit 304 provided to the rear bumper or the back door mainly acquires an image of the rear of the vehicle 300. The imaging unit 305 provided to the upper portion of the windshield in the interior of the vehicle mainly acquires an image of the front of the vehicle 300. The imaging unit 305 is used to detect, for example, a preceding vehicle, a pedestrian, an obstacle, a signal, a traffic sign, a lane, and the like.

FIG. 12 illustrates an example of imaging ranges of the imaging units 301, 302, 303, and 304 (hereinafter referred to as "imaging units 301 to 304"). An imaging range 311 represents the imaging range of the imaging unit 301 provided to the front nose. An imaging range 312 represents the imaging range of the imaging unit 302 provided to the left side mirror. An imaging range 313 represents the imaging range of the imaging unit 303 provided to the right side mirror. An imaging range 314 represents the imaging range of the imaging unit 304 provided to the rear bumper or the back door. For example, an overhead view of the vehicle 300 as viewed from above is obtained by superimposing image data that is obtained by imaging by the imaging units 301 to 304. Hereinafter, the imaging ranges 311, 312, 313, and 314 are referred to as the "imaging ranges 311 to 314".

At least one of the imaging units 301 to 304 may include a function of acquiring distance information. For example, at least one of the imaging units 301 to 304 may be a stereo camera including a plurality of imaging devices or an imaging device including pixels for phase difference detection.

For example, the microcomputer 251 (FIG. 11) calculates a distance to each three-dimensional object within the imaging ranges 311 to 314 and a temporal change in the distance (relative speed with respect to the vehicle 300) on the basis of the distance information obtained from the imaging units 301 to 304. On the basis of the calculation results, the microcomputer 251 can extract, as a preceding vehicle, a nearest three-dimensional object that is present on a traveling path of the vehicle 300 and travels in substantially the same direction as the vehicle 300 at a predetermined speed (for example, equal to or more than 0 km/h). Moreover, the microcomputer 251 can set a following distance to be maintained in front of a preceding vehicle in advance, and perform automatic brake control (including following stop control), automatic acceleration control (including following start control), or the like. According to this example, it is thus possible to perform cooperative control intended for automated driving in which the vehicle travels autonomously without depending on the operation of the driver or the like.

For example, the microcomputer 251 can classify three-dimensional object data related to three-dimensional objects into a two-wheeled vehicle, a standard-sized vehicle, a large-sized vehicle, a pedestrian, a utility pole, and other three-dimensional objects on the basis of the distance information obtained from the imaging units 301 to 304, extract the classified three-dimensional object data, and use the extracted three-dimensional object data for automatic avoidance of an obstacle. For example, the microcomputer 251 identifies obstacles around the vehicle 300 as obstacles that the driver of the vehicle 300 can recognize visually and obstacles that the driver of the vehicle 300 can hardly recognize visually. Then, the microcomputer 251 determines a collision risk indicating a risk of collision with each of the obstacles, and in a situation in which the collision risk is equal to or higher than a set value and there is thus a possibility of collision, the microcomputer 251 outputs a warning to the driver via the audio speaker 261 or the display unit 262, and performs forced deceleration or avoidance steering via the driving system control unit 210 to assist in driving to avoid collision.

At least one of the imaging units 301 to 304 may be an infrared camera that detects infrared light. The microcomputer 251 can, for example, recognize a pedestrian by determining whether or not there is a pedestrian in images obtained by imaging by the imaging units 301 to 304. Such recognition of a pedestrian is, for example, performed by a procedure of extracting characteristic points in the images obtained by imaging by the imaging units 301 to 304 as infrared cameras and a procedure of determining whether or not an object is a pedestrian by performing pattern matching processing on a series of characteristic points representing the contour of the object. In a case where the microcomputer 251 determines that there is a pedestrian in the images obtained by imaging by the imaging units 301 to 304 and recognizes the pedestrian, the sound/image output unit 252 controls the display unit 262 so that a square contour line for emphasis is displayed in a superimposed manner on the recognized pedestrian. Furthermore, the sound/image output unit 252 may also control the display unit 262 so that an icon or the like representing the pedestrian is displayed at a desired position.

Figure 13:
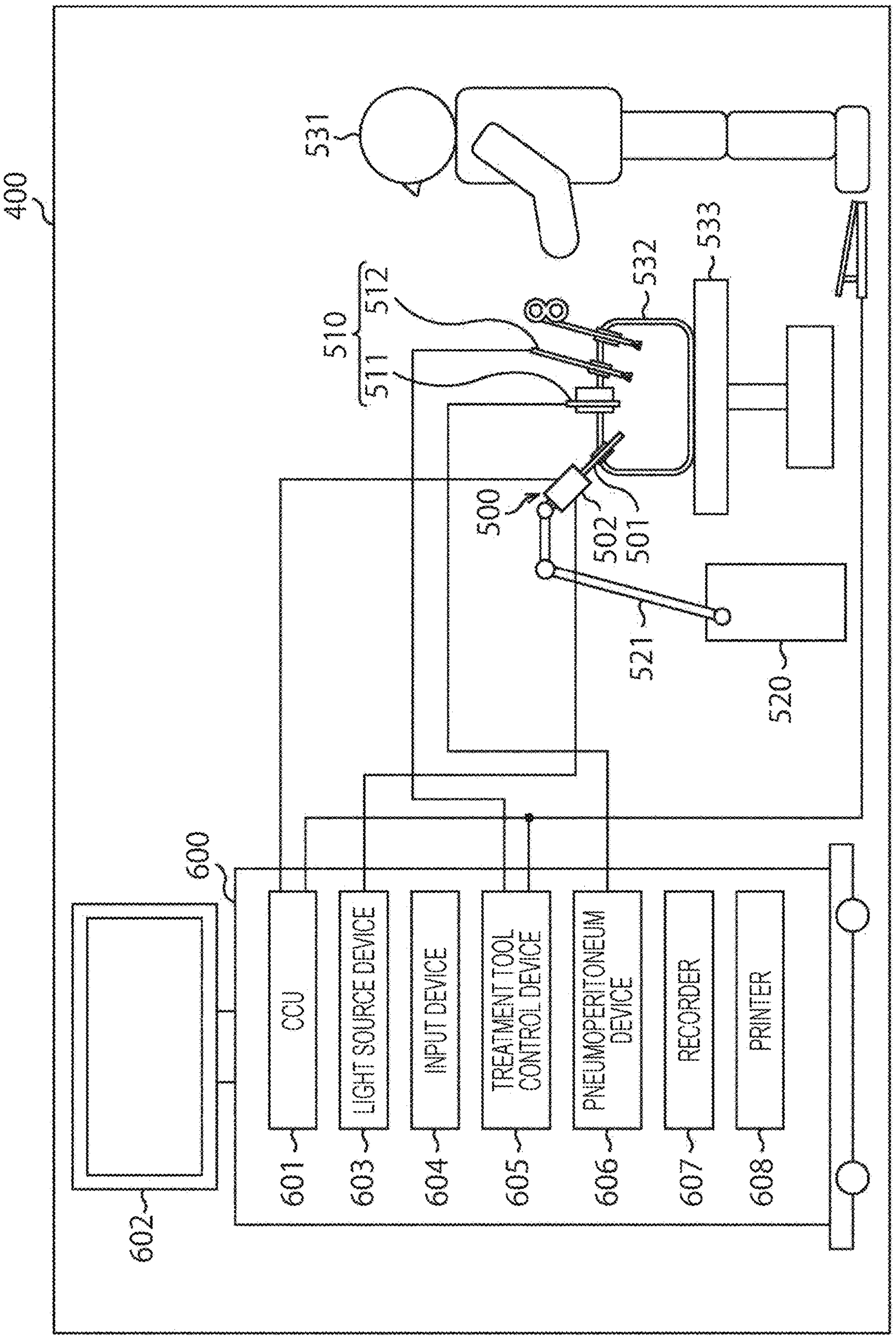
FIG. 13 is a view illustrating an example of a schematic configuration of an endoscopic surgery system.

FIG. 13 is a view illustrating an example of a schematic configuration of an endoscopic surgery system to which the technology according to the present disclosure (the present technology) can be applied.

FIG. 13 illustrates a state in which an operator (doctor) 531 is performing surgery on a patient 532 on a patient bed 533 using an endoscopic surgery system 400. As illustrated, the endoscopic surgery system 400 includes an endoscope 500, other surgical tools 510 including a pneumoperitoneum tube 511, an energy treatment tool 512, and the like, a supporting arm device 520 for supporting the endoscope 500, and a cart 600 in which various devices for endoscopic surgery are included.

The endoscope 500 includes a lens barrel 501 including a region of a predetermined length from a distal end thereof to be inserted into a body cavity of the patient 532, and a camera head 502 connected to a proximal end of the lens barrel 501. Although the illustrated example illustrates the endoscope 500 is configured as a so-called rigid endoscope including a rigid lens barrel 501, the endoscope 500 may be a so-called flexible endoscope including a flexible lens barrel.

An opening in which an objective lens is fitted is provided at the distal end of the lens barrel 501. A light source device 603 is connected to the endoscope 500, and light generated by the light source device 603 is guided to the distal end of the lens barrel by a light guide extending in the lens barrel 501 and is emitted to an observation target in the body cavity of the patient 532 through the objective lens. Note that the endoscope 500 may be a forward-viewing endoscope, an oblique-viewing endoscope, or a side-viewing endoscope.

An optical system and an imaging element are provided in the camera head 502, and light reflected by the observation target (observation light) is collected on the imaging element by the optical system. The imaging element photoelectrically converts the observation light and generates an electric signal corresponding to the observation light, that is, an image signal corresponding to an observation image. The image signal is transmitted to a camera control unit (CCU) 601 as RAW data.

The CCU 601 includes a central processing unit (CPU), a graphics processing unit (GPU), and the like, and integrally controls the operation of the endoscope 500 and a display device 602. Moreover, the CCU 601 receives the image signal from the camera head 502 and applies various types of image processing for displaying an image based on the image signal, for example, development processing (demosaicing processing) and the like on the image signal.

The display device 602 displays the image based on the image signal which has been subjected to the image processing by the CCU 601 under the control of the CCU 601.

The light source device 603 includes, for example, a light source such as a light emitting diode (LED), and supplies irradiation light for capturing an image of a surgical site or the like to the endoscope 500.

An input device 604 is an input interface for the endoscopic surgery system 11000. A user may input various types of information and instructions to the endoscopic surgery system 400 via the input device 604. For example, the user inputs an instruction and the like to change an imaging condition (type of irradiation light, magnification, focal length and the like) by the endoscope 500.

A treatment tool control device 605 controls driving of the energy treatment tool 512 for tissue cauterization, incision, blood vessel sealing, and the like. A pneumoperitoneum device 606 sends gas into the body cavity of the patient 532 via the pneumoperitoneum tube 511 in order to inflate the body cavity for a purpose of securing a field of view by the endoscope 500 and securing work space for the operator. A recorder 607 is a device that can record various types of information regarding surgery. A printer 608 is a device that can print various types of information regarding surgery in various formats such as a text, an image, or a graph.

Note that, the light source device 603 which supplies the irradiation light for capturing an image of the surgical site to the endoscope 500 may include, for example, an LED, a laser light source, or a white light source obtained by combining these. In a case where the white light source includes a combination of RGB laser light sources, because an output intensity and an output timing of each color (each wavelength) can be controlled with high accuracy, the light source device 603 can adjust white balance of an image obtained by imaging. Furthermore, in this case, by irradiating the observation target with the laser light from each of the R, G, and B laser light sources in time division and controlling driving of the imaging element of the camera head 502 in synchronism with the irradiation timing, images corresponding to R, G, and B can be obtained by imaging in time division. According to this method, a color image can be obtained even if color filters are not provided for the imaging element.

Furthermore, the driving of the light source device 603 may be controlled such that the intensity of light to be output is changed every predetermined time. By controlling driving of the imaging element of the camera head 502 in synchronism with the timing of the change of the intensity of light to acquire images time-divisionally and synthesizing the images, an image of a high dynamic range free from underexposed blocked up shadows and overexposed highlights can be created.

Furthermore, the light source device 603 may be able to supply light in a predetermined wavelength band adapted to special light observation. In the special light observation, for example, by emitting light in a narrower band than irradiation light (in other words, white light) at the time of normal observation using wavelength dependency of a body tissue to absorb light, so-called narrow band imaging is performed in which an image of a predetermined tissue, such as a blood vessel in a mucosal surface layer, is captured with high contrast. Alternatively, in special light observation, fluorescent observation for obtaining an image from fluorescent light generated by irradiation of excitation light may be performed. In fluorescent observation, for example, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source device 603 can be configured to supply narrow band light and/or excitation light adapted to such special light observation.

Figure 14:
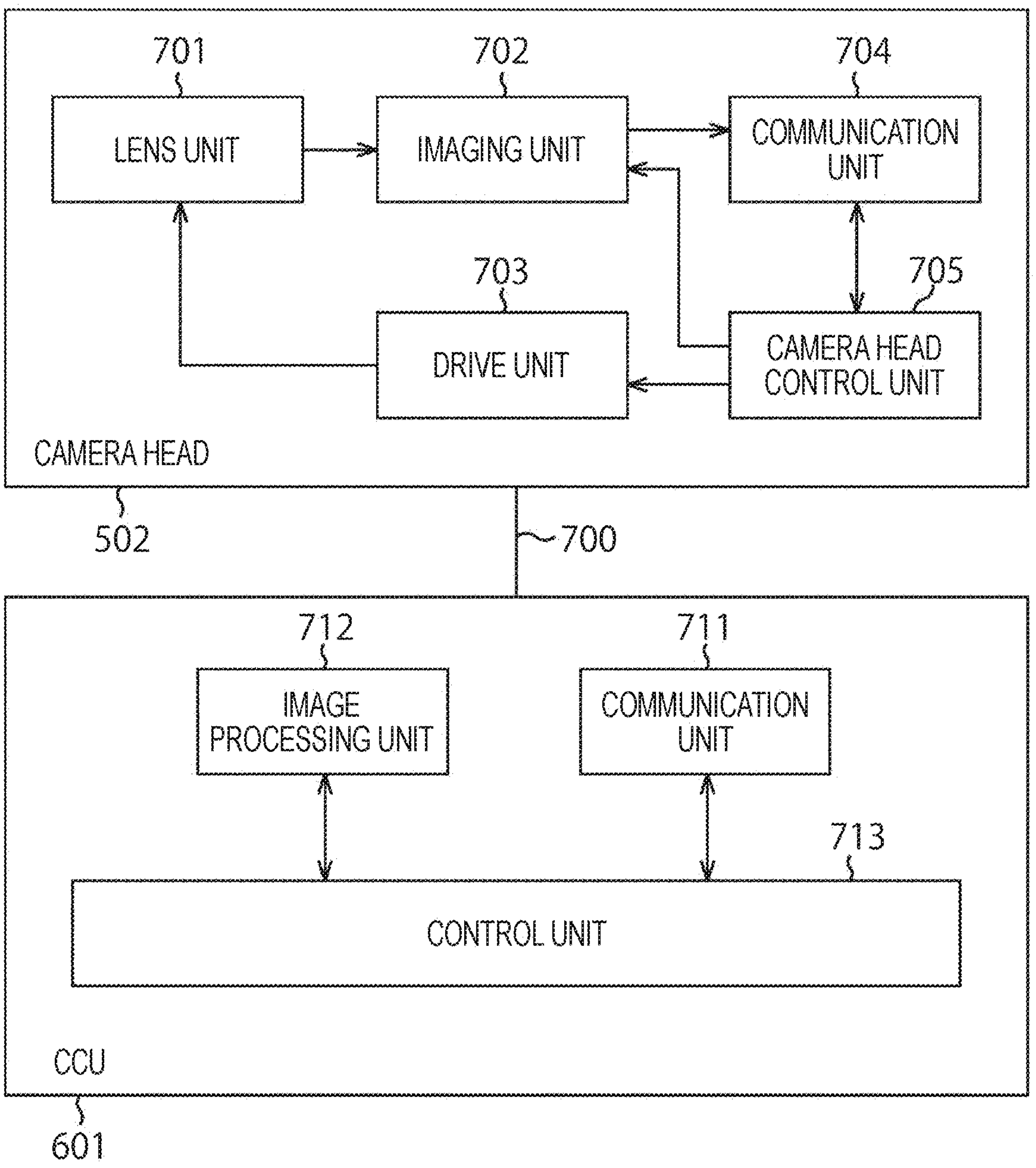
FIG. 14 is a block diagram illustrating an example of a functional configuration of a camera head and a camera control unit (CCU).

FIG. 14 is a block diagram illustrating an example of the functional configurations of the camera head 502 and the CCU 601 illustrated in FIG. 13.

The camera head 502 includes a lens unit 701, an imaging unit 702, a drive unit 703, a communication unit 704, and a camera head control unit 705. The CCU 601 includes a communication unit 711, an image processing unit 712, and a control unit 713. The camera head 502 and the CCU 601 are connected to each other communicably by a transmission cable 700.

The lens unit 701 is an optical system provided at a connection portion with the lens barrel 501. The observation light captured from the distal end of the lens barrel 501 is guided to the camera head 502 and enters the lens unit 701. The lens unit 701 is configured by combining a plurality of lenses including a zoom lens and a focus lens.

The imaging unit 702 includes an imaging element. The number of imaging elements included in the imaging unit 702 may be one (so-called single plate type) or two or more (so-called multiple plate type). In a case where the imaging unit 702 is configured as the multiple plate type, for example, image signals corresponding to R, G, and B may be generated by the respective imaging elements, and a color image may be obtained by combining the generated image signals. Alternatively, the imaging unit 702 may include a pair of imaging elements for obtaining right-eye and left-eye image signals corresponding to three-dimensional (3D) display. By performing the 3D display, the operator 531 can grasp a depth of a living body tissue in a surgical site more accurately. Note that, in a case where the imaging unit 702 is configured as the multiple plate type, a plurality of systems of lens units 701 may be provided so as to correspond to the respective imaging elements. The imaging unit 702 is, for example, the solid-state imaging device according to any of the first to fifth embodiments.

Furthermore, the imaging unit 702 is not necessarily provided in the camera head 502. For example, the imaging unit 702 may be provided inside the lens barrel 501 immediately behind the objective lens.

The drive unit 703 includes an actuator and moves the zoom lens and the focusing lens of the lens unit 701 by a predetermined distance along an optical axis under the control of the camera head control unit 705. Thus, the magnification and focal point of the image obtained by imaging by the imaging unit 702 may be appropriately adjusted.

The communication unit 704 includes a communication device for transmitting and receiving various types of information to and from the CCU 601. The communication unit 704 transmits the image signal obtained from the imaging unit 702 as the RAW data to the CCU 601 via the transmission cable 700.

Furthermore, the communication unit 704 receives a control signal for controlling driving of the camera head 502 from the CCU 601 and supplies the control signal to the camera head control unit 705. The control signal includes, for example, information regarding an imaging condition such as information specifying a frame rate of an image obtained by imaging, information specifying an exposure value at the time of imaging, and/or information specifying the magnification and focal point of the image obtained by imaging.

Note that the imaging condition such as the frame rate, exposure value, magnification, and focus described above may be appropriately specified by the user, or may be automatically set by the control unit 713 of the CCU 601 on the basis of the acquired image signal. In the latter case, the endoscope 500 includes a so-called auto exposure (AE) function, an auto focus (AF) function, and an auto white balance (AWB) function.

The camera head control unit 705 controls the driving of the camera head 502 on the basis of the control signal from the CCU 601 received via the communication unit 704.

The communication unit 711 includes a communication device for transmitting and receiving various types of information to and from the camera head 502. The communication unit 711 receives the image signal transmitted from the camera head 502 via the transmission cable 700.

Furthermore, the communication unit 711 transmits the control signal for controlling the driving of the camera head 502 to the camera head 502. The image signal and the control signal can be transmitted by electrical communication, optical communication or the like.

The image processing unit 712 performs various types of image processing on the image signal which is the RAW data transmitted from the camera head 502.

The control unit 713 performs various types of control regarding imaging of the surgical site and the like by the endoscope 500 and display of the image obtained by imaging that is obtained by the imaging of the surgical site and the like. For example, the control unit 713 generates the control signal for controlling the driving of the camera head 502.

Furthermore, the control unit 713 causes the display device 602 to display the image obtained by imaging including the surgical site and the like on the basis of the image signal subjected to the image processing by the image processing unit 712. At this time, the control unit 713 may recognize various objects in the image obtained by imaging using various image recognition technologies. For example, the control unit 713 may detect edge shapes, colors, and the like of the objects included in the image obtained by imaging, to recognize the surgical tool such as forceps, a specific living body site, bleeding, mist when the energy treatment tool 512 is used, and the like. At the time of causing the display device 602 to display the image obtained by imaging, the control unit 713 may display various types of surgery assistance information in a superimposed manner on the image of the surgical site using the recognition result. The surgery assistance information is displayed in a superimposed manner, and presented to the operator 531, so that it is possible to reduce the burden on the operator 531 and enable the operator 531 to reliably proceed with surgery.

The transmission cable 700 that connects the camera head 502 and the CCU 601 is an electric signal cable compatible with communication of electric signals, an optical fiber compatible with optical communication, or a composite cable thereof.

Here, the communication is performed by wire using the transmission cable 700 in the illustrated example, but the communication between the camera head 502 and the CCU 601 may be performed wirelessly.

Although the embodiments of the present disclosure have been described above, these embodiments may be implemented with various modifications within a scope not departing from the gist of the present disclosure. For example, two or more embodiments may be implemented in combination.

Note that the present disclosure can also have the following configurations.

(1)

A solid-state imaging device including:

a first substrate including a photodiode and a transfer transistor; and a second substrate including an active load circuit and a differential pair circuit for a comparator, in which the active load circuit includes a first transistor, the differential pair circuit includes a second transistor, and transconductance of the first transistor is smaller than transconductance of the second transistor.

(2)

The solid-state imaging device according to (1), in which an area of an LDD region on a source region side and a drain region side of the first transistor is larger than an area of an LDD region on a source region side and a drain region side of the second transistor in plan view, respectively.

(3)

The solid-state imaging device according to (2), in which an area of a source region and a drain region of the first transistor is narrower than an area of a source region and a drain region of the second transistor in plan view, respectively.

(4)

The solid-state imaging device according to (2), in which a film thickness of a sidewall insulating film of the first transistor is thicker than a film thickness of a sidewall insulating film of the second transistor.

(5)

The solid-state imaging device according to (2), in which a width of an LDD region on a source region side and a drain region side of the first transistor is equal to a film thickness of a sidewall insulating film of the first transistor, and a width of an LDD region on a source region side and a drain region side of the second transistor is equal to a film thickness of a sidewall insulating film of the second transistor.

(6)

The solid-state imaging device according to (2), in which a film thickness of a sidewall insulating film of the first transistor is equal to a film thickness of a sidewall insulating film of the second transistor.

(7)

The solid-state imaging device according to (2), in which a width of an LDD region on a source region side and a drain region side of the first transistor is different from a film thickness of a sidewall insulating film of the first transistor, and a width of an LDD region on a source region side and a drain region side of the second transistor is different from a film thickness of a sidewall insulating film of the second transistor.

(8)

The solid-state imaging device according to (1), in which a total contact area between a source region and a drain region of the first transistor and one or more contact plugs of the first transistor is smaller than a total contact area between a source region and a drain region of the second transistor and one or more contact plugs of the second transistor, respectively.

(9)

The solid-state imaging device according to (8), in which a part of the contact plugs of the first transistor is disposed on an insulating film.

(10)

The solid-state imaging device according to (9), in which the insulating film is a sidewall insulating film of the first transistor.

(11)

The solid-state imaging device according to (9), in which the insulating film is an element isolation insulating film surrounding a source region and a drain region of the first transistor in plan view.

(12)

The solid-state imaging device according to (8), in which an area of each contact plug of the first transistor is smaller than an area of each contact plug of the second transistor in plan view.

(13)

The solid-state imaging device according to (12), in which a shape of each contact plug of the first transistor is similar to a shape of each contact plug of the second transistor in plan view.

(14)

The solid-state imaging device according to (12), in which a shape of each contact plug of the first transistor is not similar to a shape of each contact plug of the second transistor in plan view.

(15)

The solid-state imaging device according to (8), in which a number of the contact plugs of the first transistor is smaller than a number of the contact plugs of the second transistor.

(16)

The solid-state imaging device according to (15), in which an area of each contact plug of the first transistor is equal to an area of each contact plug of the second transistor in plan view.

(17)

The solid-state imaging device according to (1), in which the first transistor is a transistor of a first conductivity type, and the second transistor is a transistor of a second conductivity type different from the first conductivity type.

(18)

The solid-state imaging device according to (1), in which the first transistor and the second transistor are provided on a same semiconductor substrate.

(19)

The solid-state imaging device according to (1), in which the first substrate is disposed on the second substrate, and the second substrate is disposed on a third substrate.

(20)

An electronic device including an imaging device, the imaging device including:

a first substrate including a photodiode and a transfer transistor; and a second substrate including an active load circuit and a differential pair circuit for a comparator, in which the active load circuit includes a first transistor, the differential pair circuit includes a second transistor, and transconductance of the first transistor is smaller than transconductance of the second transistor.

REFERENCE SIGNS LIST

1 Pixel array unit
2 Input unit
2*a* Input terminal
2*b* Input circuit
2*c* Amplitude change unit
2*d* Data conversion unit
3 Timing control unit
4 Row drive unit
5 Column signal processing unit
6 Image signal processing unit
7 Output unit
7*a* Data conversion unit
7*b* Amplitude change unit
7*c* Output circuit
7*d* Output terminal
11 Pixel
11*a* Pixel
11*b* Pixel
11*c* Pixel
11*d* Pixel
12 Pixel sharing unit
13 Row drive signal line
14 Column read line
21 First substrate
22 Second substrate
23 Third substrate
24 Filter layer
25 On-chip lens layer
26 Through plug
31 Semiconductor substrate
31*a* n-type region
31*b* p-type region
31*c* Floating diffusion portion
32 Element isolation insulating film
33 Gate insulating film
34 Gate electrode
35 Electrode portion
36 Interlayer insulating film
41 Semiconductor substrate
41*a* Diffusion region
41*b* Diffusion region
41*c* Diffusion region
41*d* Diffusion region
42 Gate insulating film
43 Gate electrode
44 Interlayer insulating film
45 Interlayer insulating film
46*a* Plug
46*b* Plug
46*c* Plug
46*d* Plug
47*a* Wiring layer
47*b* Wiring layer
47*c* Wiring layer
48 Pad
51 Semiconductor substrate
51*a* Diffusion region
52 Gate insulating film
53 Gate electrode
54 Interlayer insulating film
55 Interlayer insulating film
56*a* Plug
56*b* Plug
56*c* Plug
57*a* Wiring layer
57*b* Wiring layer
58 Pad
61 Comparator
62 Active load circuit
63 Differential pair circuit
71 Sidewall insulating film
73 Element isolation Insulating film

The invention claimed is:

1. A solid-state imaging device comprising:

a first substrate including a photodiode and a transfer transistor; and a second substrate including an active load circuit and a differential pair circuit for a comparator, wherein the active load circuit includes a first transistor, the differential pair circuit includes a second transistor, and transconductance of the first transistor is smaller than transconductance of the second transistor.

2. The solid-state imaging device according to claim 1, wherein an area of an LDD region on a source region side and a drain region side of the first transistor is larger than an area of an LDD region on a source region side and a drain region side of the second transistor in plan view, respectively.

3. The solid-state imaging device according to claim 2, wherein an area of a source region and a drain region of the first transistor is narrower than an area of a source region and a drain region of the second transistor in plan view, respectively.

4. The solid-state imaging device according to claim 2, wherein a film thickness of a sidewall insulating film of the first transistor is thicker than a film thickness of a sidewall insulating film of the second transistor.

5. The solid-state imaging device according to claim 2, wherein a width of an LDD region on a source region side and a drain region side of the first transistor is equal to a film thickness of a sidewall insulating film of the first transistor, and a width of an LDD region on a source region side and a drain region side of the second transistor is equal to a film thickness of a sidewall insulating film of the second transistor.

6. The solid-state imaging device according to claim 2, wherein a film thickness of a sidewall insulating film of the first transistor is equal to a film thickness of a sidewall insulating film of the second transistor.

7. The solid-state imaging device according to claim 2, wherein a width of an LDD region on a source region side and a drain region side of the first transistor is different from a film thickness of a sidewall insulating film of the first transistor, and a width of an LDD region on a source region side and a drain region side of the second transistor is different from a film thickness of a sidewall insulating film of the second transistor.

8. The solid-state imaging device according to claim 1, wherein a total contact area between a source region and a drain region of the first transistor and one or more contact plugs of the first transistor is smaller than a total contact area between a source region and a drain region of the second transistor and one or more contact plugs of the second transistor, respectively.

9. The solid-state imaging device according to claim 8, wherein a part of the contact plugs of the first transistor is disposed on an insulating film.

10. The solid-state imaging device according to claim 9, wherein the insulating film is a sidewall insulating film of the first transistor.

11. The solid-state imaging device according to claim 9, wherein the insulating film is an element isolation insulating film surrounding a source region and a drain region of the first transistor in plan view.

12. The solid-state imaging device according to claim 8, wherein an area of each contact plug of the first transistor is smaller than an area of each contact plug of the second transistor in plan view.

13. The solid-state imaging device according to claim 12, wherein a shape of each contact plug of the first transistor is similar to a shape of each contact plug of the second transistor in plan view.

14. The solid-state imaging device according to claim 12, wherein a shape of each contact plug of the first transistor is not similar to a shape of each contact plug of the second transistor in plan view.

15. The solid-state imaging device according to claim 8, wherein a number of the contact plugs of the first transistor is smaller than a number of the contact plugs of the second transistor.

16. The solid-state imaging device according to claim 15, wherein an area of each contact plug of the first transistor is equal to an area of each contact plug of the second transistor in plan view.

17. The solid-state imaging device according to claim 1, wherein the first transistor is a transistor of a first conductivity type, and the second transistor is a transistor of a second conductivity type different from the first conductivity type.

18. The solid-state imaging device according to claim 1, wherein the first transistor and the second transistor are provided on a same semiconductor substrate.

19. The solid-state imaging device according to claim 1, wherein the first substrate is disposed on the second substrate, and the second substrate is disposed on a third substrate.

20. An electronic device comprising an imaging device, the imaging device including:

a first substrate including a photodiode and a transfer transistor; and a second substrate including an active load circuit and a differential pair circuit for a comparator, wherein the active load circuit includes a first transistor, the differential pair circuit includes a second transistor, and transconductance of the first transistor is smaller than transconductance of the second transistor.

* * * * *